(12) United States Patent
Yu et al.

(10) Patent No.: US 12,205,664 B2
(45) Date of Patent: Jan. 21, 2025

(54) MEMORY CIRCUIT AND METHOD OF OPERATING SAME

(71) Applicant: TAIWAN SEMICONDUCTOR MANUFACTURING COMPANY, LTD., Hsinchu (TW)

(72) Inventors: Hua-Hsin Yu, Hsinchu (TW); Hau-Tai Shieh, Hsinchu (TW); Cheng Hung Lee, Hsinchu (TW); Hung-Jen Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 82 days.

(21) Appl. No.: 18/157,240

(22) Filed: Jan. 20, 2023

(65) Prior Publication Data

US 2023/0410854 A1    Dec. 21, 2023

Related U.S. Application Data

(60) Provisional application No. 63/352,479, filed on Jun. 15, 2022.

(51) Int. Cl.
*G11C 11/34* (2006.01)
*G11C 7/08* (2006.01)
*G11C 7/10* (2006.01)

(52) U.S. Cl.
CPC ............. *G11C 7/08* (2013.01); *G11C 7/1048* (2013.01); *G11C 7/1087* (2013.01); *G11C 7/1096* (2013.01)

(58) Field of Classification Search
CPC ....... G11C 7/08; G11C 7/1048; G11C 7/1087; G11C 7/1096
USPC .................................................. 365/185.21
See application file for complete search history.

(56) References Cited

U.S. PATENT DOCUMENTS

| | | | | | |
|---|---|---|---|---|---|
| 5,973,984 | A | * | 10/1999 | Nagaoka | G11C 11/418 365/230.03 |
| 6,134,153 | A | * | 10/2000 | Lines | G11C 7/1051 365/230.02 |
| 6,172,918 | B1 | * | 1/2001 | Hidaka | G11C 7/1048 365/189.11 |

(Continued)

FOREIGN PATENT DOCUMENTS

| | | | | | |
|---|---|---|---|---|---|
| CN | 116884453 | A | * | 10/2023 | .......... G11C 11/419 |
| TW | 594736 | | | 6/2004 | |
| TW | 202401417 | A | * | 1/2024 | .......... G11C 11/419 |

*Primary Examiner* — Viet Q Nguyen
(74) *Attorney, Agent, or Firm* — Hauptman Ham, LLP

(57) ABSTRACT

A memory circuit includes a first and a second bit line coupled to a set of memory cells, a local input output circuit including a first and a second data line, a first control circuit configured to generate a first sense amplifier signal and a second sense amplifier signal, a second control circuit configured to generate a first control signal in response to at least a second control signal or a third control signal, a switching circuit configured to transfer a first and second input signal to the corresponding first and second data line during a write operation, and to electrically isolate the first and second data line from the first and second input signal during a read operation, and a first latch configured as a sense amplifier, during the read operation, and configured as a write-in latch, during the write operation.

20 Claims, 11 Drawing Sheets

(56) References Cited

U.S. PATENT DOCUMENTS

| | | | | |
|---|---|---|---|---|
| 6,314,042 B1* | 11/2001 | Tomishima | ........... | G11C 7/1006 |
| | | | | 365/230.03 |
| 6,320,794 B1 | 11/2001 | Kang et al. | | |
| 6,418,067 B1* | 7/2002 | Watanabe | ............ | G11C 11/4076 |
| | | | | 365/230.03 |
| 6,462,584 B1* | 10/2002 | Proebsting | ................ | G11C 7/22 |
| | | | | 365/204 |
| 6,549,470 B2* | 4/2003 | Hardee | ................ | G11C 7/1048 |
| | | | | 365/230.06 |
| 6,665,203 B2* | 12/2003 | Fujisawa | ................. | G11C 8/12 |
| | | | | 365/51 |
| 7,227,798 B2 | 6/2007 | Gupta et al. | | |
| 7,489,588 B2* | 2/2009 | Hanzawa | ................. | G11C 7/12 |
| | | | | 365/207 |
| 7,630,257 B2* | 12/2009 | Madan | .................... | G11C 11/22 |
| | | | | 365/205 |
| 7,764,557 B2* | 7/2010 | Kim | ..................... | G11C 7/1096 |
| | | | | 365/207 |
| 10,037,294 B2* | 7/2018 | Onuki | ..................... | G06F 13/10 |
| 10,783,938 B2* | 9/2020 | Katoch | ..................... | G11C 7/06 |
| 10,930,323 B2* | 2/2021 | Ishizu | ....................... | G11C 8/16 |
| 10,985,954 B1* | 4/2021 | Kim | ..................... | H04L 25/028 |
| 11,295,791 B2* | 4/2022 | Katoch | .................... | G11C 7/12 |
| 2004/0136253 A1 | 7/2004 | Gupta et al. | | |
| 2004/0196716 A1 | 10/2004 | Kawagoe et al. | | |
| 2015/0228315 A1 | 8/2015 | Wang et al. | | |
| 2023/0245694 A1* | 8/2023 | Katoch | ................ | G11C 7/1048 |
| | | | | 365/185.13 |

* cited by examiner

MEMORY CIRCUIT AND METHOD OF OPERATING SAME

PRIORITY CLAIM

This application claims the benefit of U.S. Provisional Application No. 63/352,479, filed Jun. 15, 2022, which is herein incorporated by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices is also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
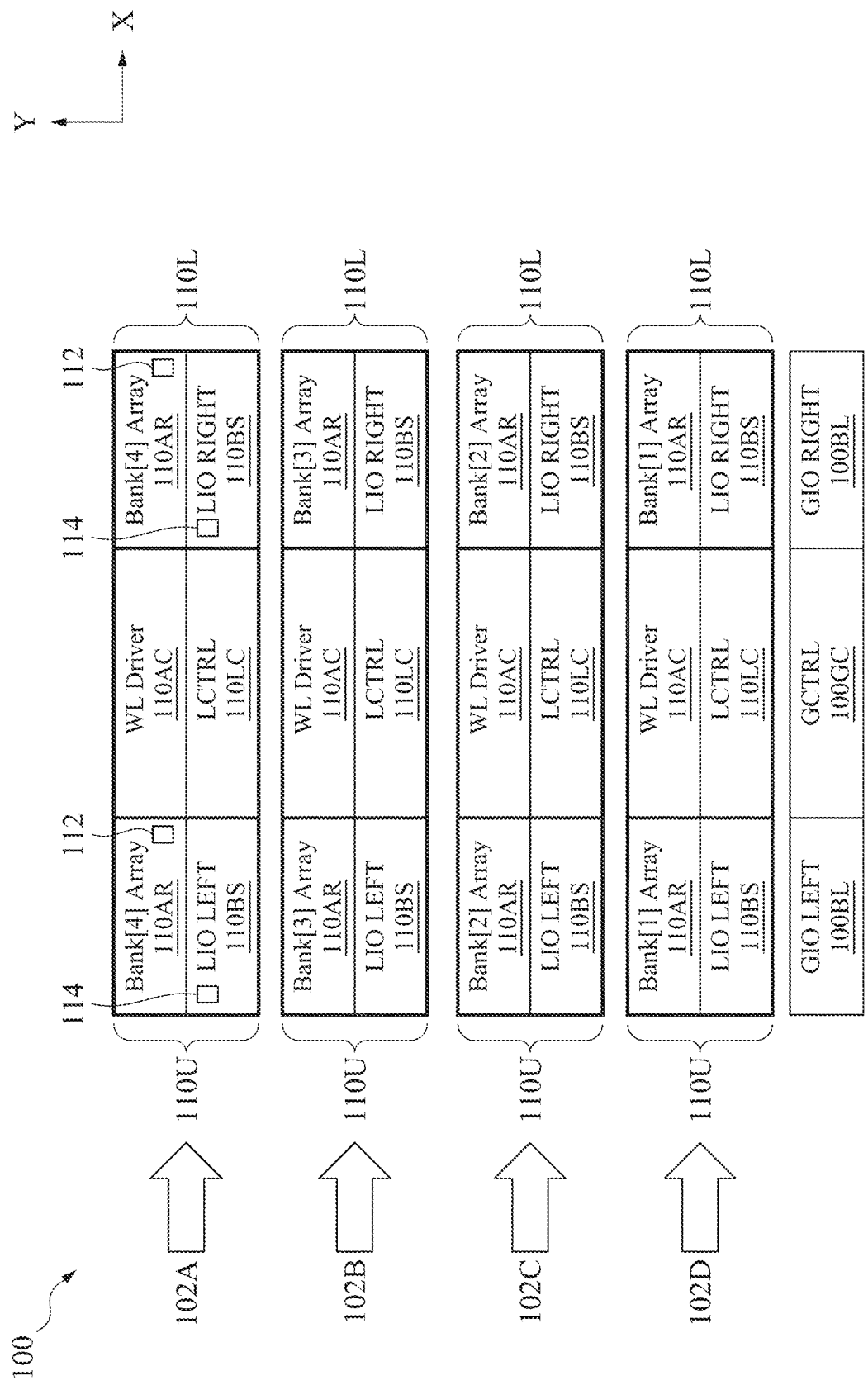
FIG. 1 is a block diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory circuit includes a set of memory cells, a first bit line and a second bit line coupled to the set of memory cells. In some embodiments, the memory circuit further includes a local input output (LIO) circuit coupled to the set of memory cells by the first bit line and the second bit line.

In some embodiments, the LIO circuit includes a first control circuit configured to generate a first sense amplifier signal and a second sense amplifier signal that is inverted from the first sense amplifier signal.

In some embodiments, the LIO circuit further includes a second control circuit configured to generate a first control signal in response to at least a second control signal or a third control signal.

In some embodiments, the LIO circuit further includes a switching circuit coupled to a first data line, a second data line and the second control circuit. In some embodiments, the switching circuit is configured to receive the third control signal.

In some embodiments, the switching circuit is configured to transfer a first input signal and a second input signal to the corresponding first data line and the second data line during a write operation of the set of memory cells. In some embodiments, the switching circuit is configured to electrically isolate the first data line and the second data line from the first input signal and the second input signal during a read operation of the set of memory cells.

In some embodiments, the LIO circuit further includes a first latch circuit coupled to the first data line, the second data line, the first control circuit and the second control circuit.

In some embodiments, the first latch circuit is configured as a sense amplifier, during the read operation, in response to the third control signal and the second sense amplifier signal.

In some embodiments, the first latch circuit is configured as a write-in latch, during the write operation, in response to the third control signal and the first control signal.

In some embodiments, by the first latch circuit to exhibit the functionality of both the sense amplifier and the write-in latch, the memory circuit includes less transistors or logic devices than other approaches where the sense amplifier circuit and the write-in latch circuit are separate circuits.

In some embodiments, by the memory circuit including less transistors or logic devices than other approaches, the memory circuit occupies less area than other approaches and consumes less power.

FIG. 1 is a block diagram of a memory circuit 100, in accordance with some embodiments.

FIG. 1 is simplified for the purpose of illustration. In some embodiments, memory circuit 100 includes various elements in addition to those depicted in FIG. 1 or is otherwise arranged so as to perform the operations discussed below.

Memory circuit 100 is an IC that includes memory partitions 102A-102D, a global control circuit 100GC and global input output (GIO) circuits 100BL.

Each memory partition 102A-102D includes memory banks 110U and 110L adjacent to a word line (WL) driver circuit 110AC and a local control circuit 110LC. Each memory bank 110U and 110L includes a memory cell array 110AR and a local input output (LIO) circuit 110BS.

A memory partition, e.g., a memory partition 102A-102D, is a portion of memory circuit 100 that includes a subset of memory devices (not shown in FIG. 1) and adjacent circuits configured to selectively access the subset of memory devices in program and read operations. In the embodiment depicted in FIG. 1, memory circuit 100 includes a total of four partitions. In some embodiments, memory circuit 100 includes a total number of partitions greater or fewer than four.

GIO circuit 100BL is a circuit configured to control access to one or more electrical paths, e.g., bit lines, to each memory device of the corresponding memory bank 110U or 110L of each memory partition 102A-102D, e.g., by generating one or more bit line signals. In some embodiments, GIO circuit 100BL includes a global bit line driver circuit. In some embodiments, GIO circuit 100BL is coupled to each memory bank 110U and 110L by a corresponding global bit line (not shown).

Global control circuit 100GC is a circuit configured to control some or all of program and read operations on each memory partition 102A-102D, e.g., by generating and/or outputting one or more control and/or enable signals.

In some embodiments, global control circuit 100GC includes one or more analog circuits configured to interface with memory partitions 102A-102D, cause data to be programmed in one or more memory devices, and/or use data received from one or more memory devices in one or more circuit operations. In some embodiments, global control circuit 100GC includes one or more global address decode or pre-decoder circuits configured to output one or more address signals to the WL driver circuit 110AC of each memory partition 102A-102D.

Each WL driver circuit 110AC is configured to generate word line signals on corresponding word lines WL. In some embodiments, each WL driver circuit 110AC is configured to output word line signals on corresponding word lines WL to the adjacent memory banks 110U and 110L of the corresponding memory partition 102A-102D.

Each local control circuit 110LC is an electronic circuit configured to receive one or more address signals. Each local control circuit 110LC is configured to generate signals corresponding to adjacent subsets of memory devices identified by the one or more address signals. In some embodiments, the adjacent subsets of memory devices correspond to columns of memory devices. In some embodiments, each local control circuit 110LC is configured to generate each signal as a complementary pair of signals. In some embodiments, each local control circuit 110LC is configured to output the signals to corresponding word line driver circuits within the adjacent WL driver circuit 110AC of the corresponding memory partition 102A-102D. In some embodiments, the local control circuit 110LC includes a bank decoder circuit.

Each LIO circuit 110BS is configured to selectively access one or more bit lines (shown in FIG. 2) coupled to adjacent subsets of memory devices of the corresponding memory cell array 110AR responsive to GIO circuit 100BL, e.g., based on one or more BL control signals. In some embodiments, the adjacent subsets of memory devices correspond to rows of memory devices. In some embodiments, the LIO circuit 110BS includes a bit line selection circuit.

Each LIO circuit 110BS includes one or more circuits 114. In some embodiments, each circuit 114 includes a circuit configured as a sense amplifier circuit and a write-in latch circuit. For example, during a write operation, circuit 114 is a write-in latch circuit that is configured to write data into at least one memory cell 112 in a corresponding column of memory cells in the corresponding memory cell array 110AR, in accordance with some embodiments. For example, during a read operation, circuit 114 is a sense amplifier circuit that is configured to read data from at least one memory cell 112 in a corresponding column of memory cells in the corresponding memory cell array 110AR, in accordance with some embodiments. In some embodiments, each circuit 114 in LIO circuit 110BS is coupled to a corresponding column of memory devices 112 in memory cell array 110AR. In some embodiments, GIO circuit 100BL includes one or more circuits 114 (not shown).

Each memory bank 110U and 110L includes the corresponding memory cell array 110AR including memory cells or memory devices 112 configured to be accessed in program and read operations by the adjacent LIO circuit 110BS and the adjacent WL driver circuit 110AC.

Each memory cell array 110AR includes an array of memory devices 112 having N rows and M columns, where M and N are positive integers. The rows of cells in memory cell array 102 are arranged in a first direction X. The columns of cells in memory cell array 102 are arranged in a second direction Y. The second direction Y is different from the first direction X. In some embodiments, the second direction Y is perpendicular to the first direction X. In some embodiments, each memory cell array 110AR is divided into an upper region and a lower region (not shown). In some embodiments, each column of memory devices 112 in memory cell array 110AR is coupled to a corresponding circuit 114 in LIO circuit 110BS.

Memory device 112 is shown in memory bank 110U and 110L of memory partition 102A. For ease of illustration, memory device 112 is not shown in memory bank 110U and 110L of memory partitions 102B, 102C and 102D.

Memory device 112 is an electrical, electromechanical, electromagnetic, or other device configured to store bit data represented by logical states. At least one logical state of memory device 112 is capable of being programmed in a write operation and detected in a read operation. In some embodiments, a logical state corresponds to a voltage level of an electrical charge stored in a given memory device 112. In some embodiments, a logical state corresponds to a physical property, e.g., a voltage, a current, a resistance or a magnetic orientation, of a component of a given memory device 112.

In some embodiments, memory device 112 includes one or more single port (SP) static random access memory (SRAM) cells. In some embodiments, memory device 112 includes one or more dual port (DP) SRAM cells. In some embodiments, memory device 112 includes one or more multi-port SRAM cells. Different types of memory cells in memory device 112 are within the contemplated scope of the present disclosure. In some embodiments, memory device 112 includes one or more dynamic random access memory (DRAM) cells. In some embodiments, memory device 112 includes one or more one-time programmable (OTP)

memory devices such as electronic fuse (eFuse) or anti-fuse devices, flash memory devices, random-access memory (RAM) devices, resistive RAM devices, ferroelectric RAM devices, magneto-resistive RAM devices, erasable programmable read only memory (EPROM) devices, electrically erasable programmable read only memory (EEPROM) devices, or the like. In some embodiments, memory device 112 is an OTP memory device including one or more OTP memory cells.

Other configurations of memory circuit 100 are within the scope of the present disclosure.

Figure 2:
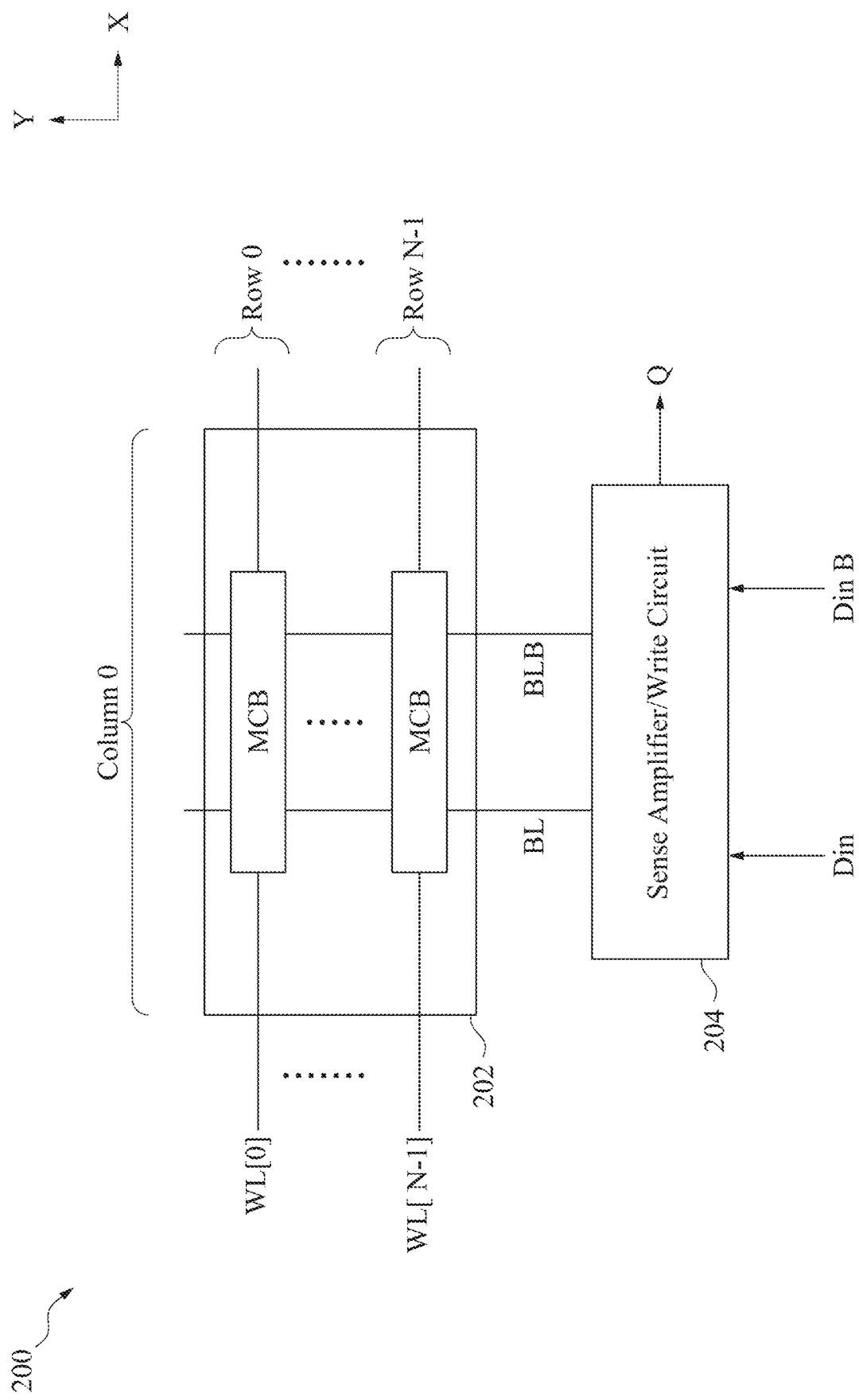
FIG. 2 is a circuit diagram of a memory circuit, in accordance with some embodiments.

FIG. 2 is a circuit diagram of a memory circuit 200, in accordance with some embodiments.

Memory circuit 200 is an embodiment of one column of memory cells of memory cell array 110AR and circuit 114 of FIG. 1, and similar detailed description is therefore omitted. For example, memory circuit 200 illustrates a non-limiting example where a memory cell array 202 of memory circuit 200 is an embodiment of one column of memory cells in memory cell array 110AR of FIG. 1, and sense amplifier circuit/write circuit 204 of memory circuit 200 corresponds to circuit 114 of FIG. 1, and similar detailed description is therefore omitted. In some embodiments, sense amplifier circuit/write circuit 204 of memory circuit 200 is useable in GIO circuit 100BL in FIG. 1 in a manner similar to circuit 114 of LIO circuit 110BS, and similar detailed description is therefore omitted.

Memory circuit 200 includes a memory cell array 202 coupled to a sense amplifier circuit/write circuit 204 by bit line BL and bit line bar BLB.

Memory cell array 202 includes an array of memory cells MCB having N rows and one column, where N is a positive integer. One column is shown as a non-limiting example. Other column numbers for memory cell array 202 is within the scope of the present disclosure. In some embodiments, each column of memory cells 112 in memory cell array 102 of FIG. 1 is coupled to a corresponding sense amplifier circuit/write circuit 204.

Sense amplifier circuit/write circuit 204 is a circuit configured as a sense amplifier circuit and a write-in latch circuit. For example, during a write operation, sense amplifier circuit/write circuit 204 is a write-in latch circuit that is configured to receive input data (e.g., Din and DinB) on data input lines, and is configured to write data (e.g., Din or DinB) into at least one memory cell MCB in column 0 of memory cell array 202, in accordance with some embodiments.

For example, during a read operation, sense amplifier circuit/write circuit 204 is a sense amplifier circuit that is configured to sense or read data from at least one memory cell MCB in column 0 of memory cell array 202, and is configured to output a data signal Q, in accordance with some embodiments. In some embodiments, the data signal Q corresponds to the data read from the at least one memory cell MCB in column 0 of memory cell array 202. In some embodiments, the data signal Q corresponds to the data stored in the at least one memory cell MCB in column 0 of memory cell array 202.

In some embodiments, by configuring sense amplifier circuit/write circuit 204 to exhibit the functionality of both a sense amplifier circuit and a write-in latch circuit, sense amplifier circuit/write circuit 204 includes less transistors or logic devices than other approaches where the sense amplifier circuit and the write-in latch circuit are separate circuits.

In some embodiments, by the sense amplifier circuit/write circuit 204 including less transistors or logic devices than other approaches, the sense amplifier circuit/write circuit 204 occupies less area than other approaches.

In some embodiments, by the sense amplifier circuit/write circuit 204 including less transistors or logic devices than other approaches, sense amplifier circuit/write circuit 204 consumes less active power than other approaches because fewer transistors or logic devices in sense amplifier circuit/write circuit 204 are toggling between logic high and logic low states and vice versa In some embodiments, by the sense amplifier circuit/write circuit 204 including less transistors or logic devices than other approaches, sense amplifier circuit/write circuit 204 has less standby leakage than other approaches because fewer transistors or logic devices in sense amplifier circuit/write circuit 204 results in a lower overall gate count than other approaches.

Other configurations of memory circuit 200 are within the scope of the present disclosure.

Memory Cell

Figure 3:
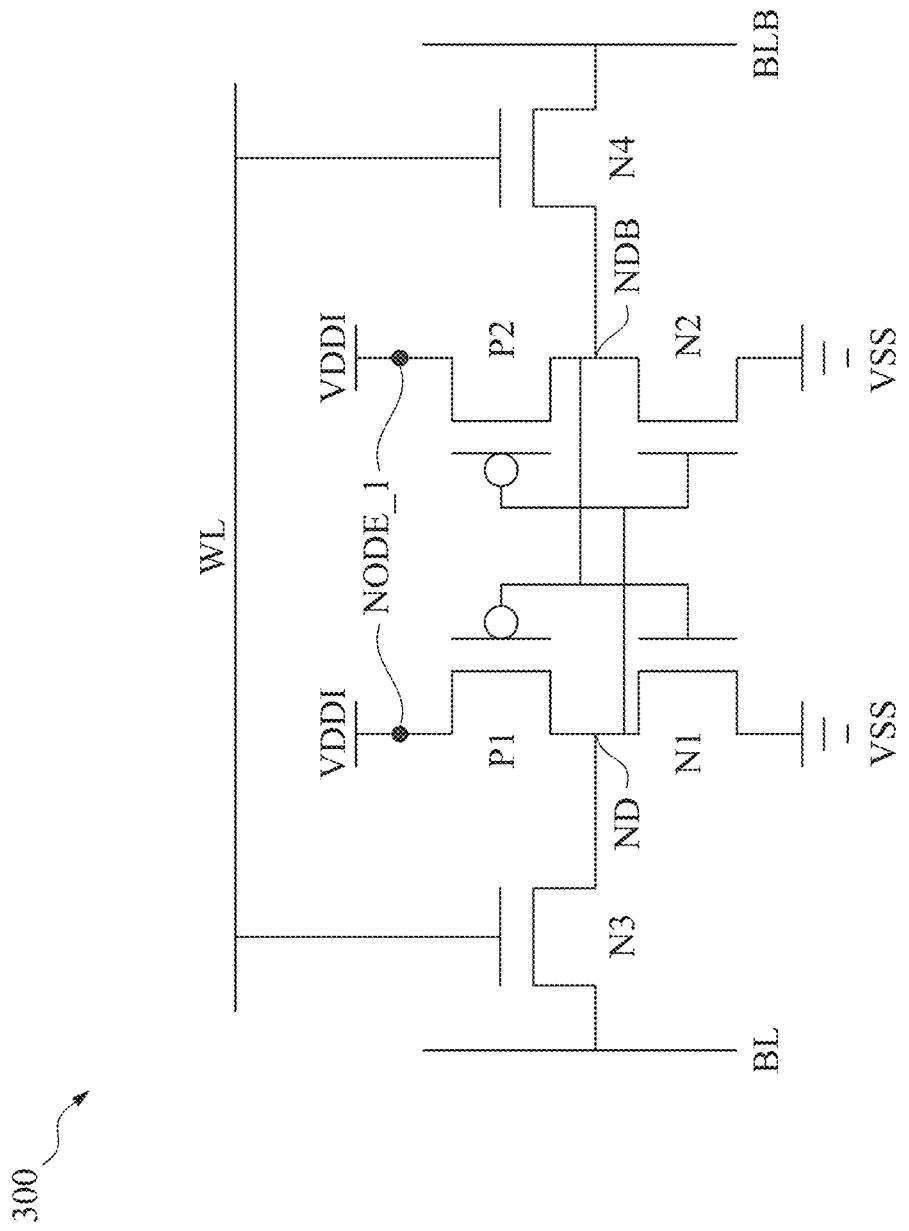
FIG. 3 is a circuit diagram of a memory cell usable in FIGS. 1 and 2, in accordance with some embodiments.

FIG. 3 is a circuit diagram of a memory cell 300 usable in FIGS. 1 and 2, in accordance with some embodiments.

Memory cell 300 is usable as one or more memory cells MCB in at least one of memory cell array 110AR of FIG. 1, memory device 112 of FIG. 1, memory cell MCB of FIG. 2 or memory cell array 202 of FIG. 2.

Memory cell 300 is a six transistor (6T) single port (SP) SRAM memory cell used for illustration. In some embodiments, memory cell 300 employs a number of transistors other than six. Other types of memory are within the scope of various embodiments.

Memory cell 300 comprises two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or a pair of cross-coupled inverters. For example, PMOS transistor P1 and NMOS transistor N1 form a first inverter while PMOS transistor P2 and NMOS transistor N2 form a second inverter.

A source terminal of each of PMOS transistors P1 and P2 are configured as a voltage supply node NODE_1. Each voltage supply node NODE_1 is coupled to a first voltage supply VDDI. A drain terminal of PMOS transistor P1 is coupled with a drain terminal of NMOS transistor N1, a gate terminal of PMOS transistor P2, a gate terminal of NMOS transistor N2, and a source terminal of NMOS transistor N3, and is configured as a storage node ND.

A drain terminal of PMOS transistor P2 is coupled with a drain terminal of NMOS transistor N2, a gate terminal of PMOS transistor P1, a gate terminal of NMOS transistor N1, and a source terminal of NMOS transistor N4, and is configured as a storage node NDB. A source terminal of each of NMOS transistors N1 and N2 is configured as a supply reference voltage node (not labelled) having a supply reference voltage VSS. The source terminal of each of NMOS transistors N1 and N2 is also coupled to reference voltage supply VSS.

A word line WL is coupled with a gate terminal of each of NMOS transistors N3 and N4. Word line WL is also called a write control line because NMOS transistors N3 and N4 are configured to be controlled by a signal on word line WL in order to transfer data between bit lines BL, BLB and corresponding nodes ND, NDB.

A drain terminal of NMOS transistor N3 is coupled to a bit line BL. A drain terminal of NMOS transistor N4 is coupled to a bit line BLB. Bit lines BL and BLB are configured as both data input and output for memory cell 300. In some embodiments, in a write operation, applying a logical value to a bit line BL and the opposite logical value to the other bit line BLB enables writing the logical values on the bit lines to memory cell 300. Each of bit lines BL and BLB is called a data line because the data carried on bit lines BL and BLB are written to and read from corresponding nodes ND and NDB.

Word line WL corresponds to one or more word lines WL in FIG. 2. Bit line BL corresponds to one or more bit lines BL in FIG. 2. Bit line bar BLB corresponds to one or more bit line bars BLB in FIG. 2.

Other configurations of memory cell 300 are within the scope of the present disclosure.

Memory Circuit

Figure 4:
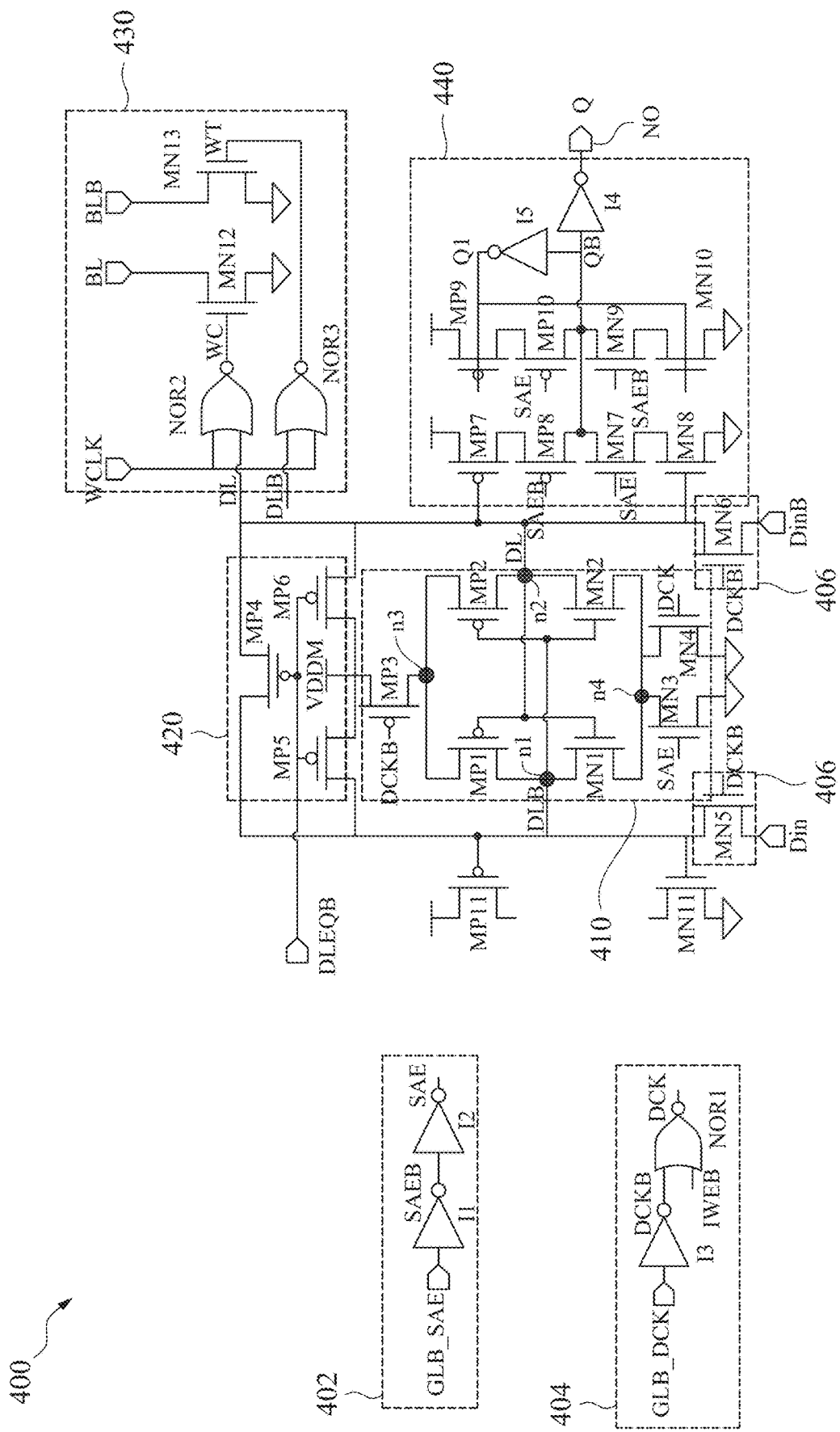
FIG. 4 is a circuit diagram of a memory circuit, in accordance with some embodiments.

FIG. 4 is a circuit diagram of a memory circuit 400, in accordance with some embodiments.

Memory circuit 400 is an embodiment of sense amplifier circuit/write circuit 204 of FIG. 2, and similar detailed description is therefore omitted. Memory circuit 700 of FIG. 7 (described below), and memory circuit 800 of FIG. 8 (described below) are embodiments of sense amplifier circuit/write circuit 204 of FIG. 2, and similar detailed description is therefore omitted.

Memory circuit 400 includes a control signal generating circuit 402 coupled to a latch circuit 410 and a latch circuit 440. For ease of illustration, control signal generating circuit 402 is not shown as being coupled to latch circuit 410 and latch circuit 440.

Control signal generating circuit 402 is configured to control the latch circuit 410 by a sense amplifier enable signal SAE. Control signal generating circuit 402 is configured to control the latch circuit 440 by the sense amplifier enable signal SAE and an inverted sense amplifier enable signal SAEB. Control signal generating circuit 402 is configured to generate the inverted sense amplifier enable signal SAEB in response to a global sense amplifier enable signal GLB_SAE. Control signal generating circuit 402 is further configured to generate the sense amplifier enable signal SAE in response to the inverted sense amplifier enable signal SAEB. In some embodiments, sense amplifier enable signal SAE is inverted from the inverted sense amplifier enable signal SAEB. In some embodiments, control signal generating circuit 402 is coupled to GIO circuit 100BL in FIG. 1, and is configured to receive the global sense amplifier enable signal GLB_SAE from the GIO circuit 100BL in FIG. 1.

Control signal generating circuit 402 includes an inverter I1 and an inverter I2.

Inverter I1 is configured to generate the inverted sense amplifier enable signal SAEB in response to the global sense amplifier enable signal GLB_SAE. In some embodiments, the global sense amplifier enable signal GLB_SAE is inverted from the inverted sense amplifier enable signal SAEB. An input terminal of inverter I1 is configured to receive the global sense amplifier enable signal GLB_SAE. In some embodiments, the input terminal of inverter I1 is coupled to GIO circuit 100BL in FIG. 1. An output terminal of inverter I1 is coupled to an input terminal of inverter I2, and is configured to output the inverted sense amplifier enable signal SAEB. The output terminal of inverter I1 is further coupled to latch circuit 440.

Inverter I2 is configured to generate the sense amplifier enable signal SAE in response to the inverted sense amplifier enable signal SAEB. An input terminal of inverter I2 is coupled to the output terminal of inverter I1, and is configured to receive the inverted sense amplifier enable signal SAEB. An output terminal of inverter I2 is coupled to latch circuit 410 and latch circuit 440. The output terminal of inverter I2 is configured to output the sense amplifier enable signal SAE.

Other configurations, other types of circuit elements or numbers of circuit elements in control signal generating circuit 402 are within the scope of the present disclosure.

Memory circuit 400 further includes a control signal generating circuit 404 coupled to a switching circuit 406 and latch circuit 410. For ease of illustration, control signal generating circuit 404 is not shown as being coupled to switching circuit 406 and latch circuit 410.

Control signal generating circuit 404 is configured to control the switching circuit 406 by a control signal DCKB. Control signal generating circuit 404 is configured to control the latch circuit 410 by a control signal DCK and the control signal DCKB. Control signal generating circuit 404 is configured to generate the control signal DCKB in response to a global control signal GLB_DCK. In some embodiments, the control signal GLB_DCK is a clock signal. Control signal generating circuit 404 is further configured to generate the control signal DCK in response to the control signal DCKB and a control signal IWEB. In some embodiments, control signal IWEB is an inverse write enable signal that is configured as a logic 1 during a read operation of one or more memory cells coupled to memory circuit 400. In some embodiments, control signal IWEB is an inverse write enable signal that is configured as a logic 0 during a write operation of one or more memory cells coupled to memory circuit 400. In some embodiments, control signal IWEB is generated by an external circuit (not shown). In some embodiments, control signal generating circuit 404 is coupled to GIO circuit 100BL in FIG. 1, and is configured to receive the global control signal GLB_DCK from the GIO circuit 100BL in FIG. 1.

Control signal generating circuit 404 includes an inverter I3 and a NOR logic gate NOR1.

Inverter I3 is configured to generate the control signal DCKB in response to the global control signal GLB_DCK. In some embodiments, the control signal DCKB is inverted from the global control signal GLB_DCK. An input terminal of inverter I3 is configured to receive the global control signal GLB_DCK. In some embodiments, the input terminal of inverter I3 is coupled to GIO circuit 100BL in FIG. 1. An output terminal of inverter I3 is coupled to a first input terminal of NOR logic gate NOR1, and is configured to output the control signal DCKB. The output terminal of inverter I3 is further coupled to switching circuit 406 and latch circuit 410.

The first input terminal of NOR logic gate NOR1 is configured to receive control signal DCKB. A second input terminal of NOR logic gate NOR1 is configured to receive control signal IWEB. In some embodiments, the second input terminal of NOR logic gate NOR1 is directly coupled to a source (not shown) of the control signal IWEB. An output terminal of NOR logic gate NOR1 is configured to output the control signal DCK. NOR logic gate NOR1 is configured to generate the control signal DCK based on the control signal DCKB and the control signal IWEB. An output terminal of NOR logic gate NOR1 is coupled to the latch circuit 410.

Other configurations, other types of circuit elements or numbers of circuit elements in control signal generating circuit 404 are within the scope of the present disclosure.

Memory circuit 400 further includes a switching circuit 406. The switching circuit 406 is configured to receive input signals Din and DinB. The switching circuit 406 is configured to transmit the input signals Din and DinB to the latch circuit 410 through a data line DL and a data line bar DLB, respectively.

Switching circuit 406 is enabled or disabled in response to the control signal DCKB. For example, during a write operation of one or more memory cells (e.g., memory cell MCB in FIG. 2) coupled to memory circuit 400, the switching circuit 406 is enabled by the control signal DCKB, and the switching circuit 406 is configured to couple the data line DL and the data line bar DLB to an input circuit (e.g., input circuit 504 in FIG. 5), in accordance with some embodiments. For example, during a read operation of one or more memory cells (e.g., memory cell MCB in FIG. 2) coupled to memory circuit 400, the switching circuit 406 is disabled by the control signal DCKB, and the switching circuit 406 is configured to decouple the data line DL and the data line bar DLB from the input circuit (e.g., input circuit 504 in FIG. 5), in accordance with some embodiments.

In some embodiments, the switching circuit 406 is configured to transfer an input signal Din and an input signal DinB to the corresponding data line DL and the data line bar DLB during a write operation of one or more memory cells. In some embodiments, the switching circuit is configured to electrically isolate the data line DL and the data line bar DLB from the corresponding input signal Din and the input signal DinB during a read operation of one or more memory cells.

In some embodiments, by electrically isolating the data line DL and the data line bar DLB from the corresponding input signal Din and the input signal DinB during a read operation of one or more memory cells, a latch circuit 410 can be configured as a sense amplifier during the read operation. In some embodiments, by configuring the switching circuit 406 to transfer the input signal Din and the input signal DinB to the corresponding data line DL and the data line bar DLB during the write operation of one or more memory cells, the latch circuit 410 is configured as a write-in latch during the write operation.

Switching circuit 406 includes NMOS transistors MN5 and MN6.

A source of NMOS transistor MN5 is configured to receive the data signal Din. The source of NMOS transistor MN5 is coupled to a source of the data signal Din (e.g., input circuit 504 in FIG. 5). A gate of NMOS transistor MN5 is configured to receive the control signal DCKB, and is coupled to the output terminal of inverter 13 and a gate of NMOS transistor MN6. A drain of NMOS transistor MN5 is coupled to at least the data line bar DLB and a node n1.

A source of NMOS transistor MN6 is configured to receive the data signal DinB. The source of NMOS transistor MN6 is coupled to a source of the data signal DinB (e.g., input circuit 504 in FIG. 5). A gate of NMOS transistor MN6 is configured to receive the control signal DCKB, and is coupled to the output terminal of inverter 13 and the gate of NMOS transistor MN5. A drain of NMOS transistor MN6 is coupled to at least the data line DL and a node n2.

Other configurations, numbers of transistor or types of transistors in switching circuit 406 are within the scope of the present disclosure. For example, in some embodiments, the source and drain of NMOS transistor MN5 are switched with each other, and the source and drain of NMOS transistor MN6 are switched with each other. For example, in some embodiments, NMOS transistors MN5 and MN6 can be replaced with corresponding transmission gates.

Memory circuit 400 further includes latch circuit 410. Latch circuit 410 is coupled to the control signal generating circuit 402, control signal generating circuit 404, switching circuit 406, a pre-charge and equalization circuit 420, an output circuit 430, a latch circuit 440, a PMOS transistor MP11 and a NMOS transistor MN11. Latch circuit 410 is configured to receive at least one of the sense amplifier enable signal SAE, the control signal DCK or the control signal DCKB. Latch circuit 410 is enabled or disabled responsive to at least one of the sense amplifier enable signal SAE, the control signal DCK or the control signal DCKB.

Latch circuit 410 is coupled to at least the data line bar DLB at node n1 and is coupled to the data line DL at node n2. Latch circuit 410 is configured to latch the data line bar signal on the data line bar DLB at node n1, and is configured to latch the data line signal on the data line DL at node n2.

At least latch circuit 410 is a circuit configured as a sense amplifier circuit and a write-in latch circuit. For example, in some embodiments, during a read operation, latch circuit 410 and latch circuit 440 are configured to function as a sense amplifier that is configured to sense or read data stored in one or more memory cells (e.g., memory cell MCB in FIG. 2) coupled to memory circuit 400 through a bit line split between bit line BL and bit line bar BLB. In some embodiments, during a read operation, at least latch circuit 410 is configured to function as a part of a sense amplifier in response to sense amplifier enable signal SAE and control signal DCKB.

For example, in some embodiments, during a write operation, latch circuit 410, switching circuit 406 and output circuit 430 are a write-in latch circuit that is configured to receive input data (e.g., Din and DinB) on data input lines, latch the input data (e.g., Din and DinB) on data line DL and data line bar DLB, and is configured to write data (e.g., Din or DinB) into one or more memory cells (e.g., memory cell MCB in FIG. 2) coupled to memory circuit 400. In some embodiments, during a write operation, at least latch circuit 410 is configured to function as a part of a write-in latch circuit in response to control signal DCK and control signal DCKB.

Latch circuit 410 comprises PMOS transistors MP1, MP2 and MP3, and NMOS transistors MN1, MN2, MN3 and MN4. Transistors MP1, MP2, MN1, and MN2 form a cross latch or a pair of cross-coupled inverters. For example, PMOS transistor MP1 and NMOS transistor MN1 form a first inverter (not labelled) while PMOS transistor MP2 and NMOS transistor MN2 form a second inverter (not labelled).

Each of a drain of PMOS transistor MP1, a drain of NMOS transistor MN1, a gate of PMOS transistor MP2, and a gate of NMOS transistor MN2 are coupled together at node n1. Node n1 is coupled with data line bar DLB. In some embodiments, node n1 is configured as a storage node. The drains of each of PMOS transistor MP1 and NMOS transistor MN1 and the gates of each of PMOS transistor MP2 and NMOS transistor MN2 are coupled to data line bar DLB.

Each of a source of PMOS transistor MP1, a source of PMOS transistor MP2 and a drain of PMOS transistor MP3 are coupled together at a node n3. A source of PMOS transistor MP3 is configured as a voltage supply node (not labelled), and is coupled to a voltage supply VDDM. Each of the source of PMOS transistor MP3, a source of PMOS transistor MP5 and a source of PMOS transistor MP6 are coupled together, and are further coupled to the voltage supply VDDM. A gate of PMOS transistor MP3 is configured to receive a control signal DCKB. The gate of PMOS transistor MP3 is coupled to the output terminal of inverter 13. In some embodiments, PMOS transistor MP3 is referred to as a "header switch."

Each of a drain of PMOS transistor MP2, a drain of NMOS transistor MN2, a gate of PMOS transistor MP1, and a gate of NMOS transistor MN1 are coupled together at node n2. Node n2 is coupled with data line DL. In some embodiments, node n2 is configured as a storage node. The drains of each of PMOS transistor MP2 and NMOS transistor MN2 and the gates of each of PMOS transistor MP1 and NMOS transistor MN1 are coupled to data line DL.

Each of a drain of NMOS transistor MN3, a drain of NMOS transistor MN4, a source of NMOS transistor MN1 and a source of NMOS transistor MN2 are coupled together at a node n4. A source of NMOS transistor MN3 is configured as a supply reference voltage node (not labelled) having a supply reference voltage VSS. A source of NMOS transistor MN4 is configured as a supply reference voltage node (not labelled) having the supply reference voltage VSS. In some embodiments, the source of NMOS transistor MN3 and the source of NMOS transistor MN4 are coupled together.

A gate of NMOS transistor MN3 is configured to receive the sense amplifier enable signal SAE. The gate of NMOS transistor MN3 is coupled to the output terminal of inverter 12. A gate of NMOS transistor MN4 is configured to receive the control signal DCK. The gate of NMOS transistor MN4 is coupled to the output terminal of NOR logic gate NOR1. In some embodiments, NMOS transistor MN3 is referred to as a "first footer switch", and NMOS transistor MN4 is referred to as a "second footer switch."

In some embodiments, latch circuit 410 is enabled and configured to function as a sense amplifier when control signal DCKB is a low logical value, and the sense amplifier enable signal SAE is a high logical value. For example, when control signal DCKB is applied to PMOS transistor MP3 with a low logical value, PMOS transistor MP3 turns on, and pulls node n3 toward a voltage level of supply voltage VDDM. Similarly, for example, when sense amplifier enable signal SAE is applied to NMOS transistor MN3 with a high logical value, NMOS transistor MN3 turns on, and pulls node n4 toward a voltage level of supply reference voltage VSS. As a result, the latch circuit 410 is enabled and is configured to amplify the voltage level of data line DL and data line bar DLB, and is configured to output a read data of the memory cell to latch circuit 440.

In some embodiments, latch circuit 410 is enabled and configured to function as a write-in latch circuit when control signal DCKB is a low logical value, and control signal DCK is a high logical value. For example, when control signal DCKB is applied to PMOS transistor MP3 with a low logical value, PMOS transistor MP3 turns on, and pulls node n3 toward a voltage level of supply voltage VDDM. Similarly, for example, when control signal DCK is applied to NMOS transistor MN4 with a high logical value, NMOS transistor MN4 turns on, and pulls node n4 toward a voltage level of supply reference voltage VSS. As a result, the latch circuit 410 is enabled and is configured to output a write data (e.g., Din or DinB) to output circuit 430.

Other configurations, numbers of transistor or types of transistors in latch circuit 410 are within the scope of the present disclosure.

Memory circuit 400 further includes a pre-charge and equalization circuit 420.

Pre-charge and equalization circuit 420 is coupled to data line DL, data line bar DLB, switching circuit 406, latch circuit 410, output circuit 430, latch circuit 440, PMOS transistor MP11 and NMOS transistor MN11.

Pre-charge and equalization circuit 420 is configured to pre-charge and equalize data line DL and data line bar DLB to a voltage VDL responsive to a signal DLEQB. In some embodiments, pre-charge and equalization circuit 420 is configured to pre-charge and equalize data line DL and data line bar DLB to the voltage VDL prior to a read operation of one or more memory cells (e.g., memory cell MCB in FIG. 2) coupled to memory circuit 400. In some embodiments, pre-charge and equalization circuit 420 is configured to pre-charge and equalize data line DL and data line bar DLB (or bit line BL and bit line bar BLB) to the voltage VDL prior to the word line WL provides access or couples the storage node ND and NDB to the corresponding bit line BL and bit line BLB in an NAP design. In some embodiments, pre-charge and equalization circuit 420 is configured to pre-charge and equalize data line DL and data line bar DLB (or bit line BL and bit line bar BLB) to the voltage VDL after the word line WL provides access or couples the storage node ND and NDB to the corresponding bit line and bit line BLB in a non-NAP design. In some embodiments, voltage VDL is equal to a supply voltage VDDM. In some embodiments, voltage VDL is equal to a supply reference voltage VSS. In some embodiments, voltage VDL is equal to a supply voltage VDDM/2.

Pre-charge and equalization circuit 420 comprises PMOS transistors MP5, MP6 and MP4. PMOS transistors MP5 and MP6 are a pre-charge circuit. PMOS transistors MP5 and MP6 are configured to pre-charge data line DL and data line bar DLB to voltage VDL responsive to signal DLEQB. PMOS transistor MP4 is an equalization circuit. PMOS transistor MP4 is configured to equalize the voltage of data line DL and data line bar DLB to voltage VDL responsive to signal DLEQB. Gates of PMOS transistors MP5, MP6 and MP4 are coupled together, and configured to receive signal DLEQB. In some embodiments, signal DLEQB is at least a pre-charge signal or an equalization signal.

Sources of PMOS transistors MP6 and MP5 are coupled with data line DL and data line bar DLB, respectively. Drains of PMOS transistors MP5 and MP6 are coupled together and are configured to receive supply voltage VDDM. For example, when signal DLEQB is applied with a low logical value, transistors MP5 and MP6 are turned on, and pull corresponding data line DL and data line bar DLB to the supply voltage VDDM. As a result, data line DL and data line bar DLB are pre-charged to the supply voltage VDDM.

PMOS transistor MP4 is coupled between data line DL and data line bar DLB. A source of PMOS transistor MP4 is coupled with data line bar DLB. A drain of PMOS transistor MP4 is coupled with data line DL. For example, when signal DLEQB is applied with a low logical value, transistor MP4 is turned on, and couples data line bar DLB to data line DL. As a result, the voltage of data line DL and data line bar DLB are equalized to the supply voltage VDDM. In some embodiments, the drain and the source of each of PMOS transistors MP5, MP6 and MP4 are used interchangeably.

Other configurations, numbers of transistor or types of transistors in pre-charge and equalization circuit 420 are within the scope of the present disclosure. For example, other circuits and/or other types of transistors, such as NMOS transistors, or quantities of transistors, are used to pre-charge and/or equalize data line DL and data line bar DLB are within the scope of various embodiments. Other values of voltage VDL are within the scope of various embodiments.

Memory circuit 400 further includes an output circuit 430. Output circuit 430 is coupled to data line DL, data line bar DLB, pre-charge and equalization circuit 420, switching circuit 406, latch circuit 410, latch circuit 440, PMOS transistor MP11 and NMOS transistor MN11. Output circuit 430 is further coupled to one or more memory cells (not shown), and is configured to control a write operation of the one or more memory cells.

Output circuit 430 includes a NOR logic gate NOR2, a NOR logic gate NOR3 and NMOS transistors MN12 and MN13.

NOR logic gate NOR2 is configured to generate a signal WC. Signal WC controls the NMOS transistor MN12. NOR logic gate NOR2 has a first input terminal coupled with at least the data line DL, and a second input terminal configured to receive a control signal WCLK. In some embodiments, the control signal WCLK is a clock signal. In some embodiments, control signal WCLK is logically low for a write operation. In some embodiments, control signal WCLK is logically high for a read operation. The NOR logic gate NOR2 has an output terminal coupled to a gate of NMOS transistor MN12. The output terminal of NOR logic gate NOR2 is configured to output the signal WC to NMOS transistor MN12.

NOR logic gate NOR3 is configured to generate a signal WT. Signal WT controls the NMOS transistor MN13. NOR logic gate NOR3 has a first input terminal coupled with at least the data line bar DLB, and a second input terminal configured to receive the control signal WCLK. The NOR logic gate NOR3 has an output terminal coupled to a gate of NMOS transistor MN13. The output terminal of NOR logic gate NOR3 is configured to output the signal WT to NMOS transistor MN13.

NMOS transistor MN12 is coupled to NOR logic gate NOR2 and a bit line BL.

A gate of NMOS transistor MN12 is configured to receive the signal WC. The gate of NMOS transistor MN12 is coupled to the output terminal of NOR logic gate NOR2. A source of NMOS transistor MN12 is coupled to the reference voltage supply VSS. A drain of NMOS transistor MN12 is coupled to the bit line BL. In some embodiments, the bit line BL and the bit line bar BLB are coupled to one or more memory cells (not shown).

NMOS transistor MN13 is coupled to NOR logic gate NOR 3 and a bit line bar BLB.

A gate of NMOS transistor MN13 is configured to receive the signal WT. The gate of NMOS transistor MN13 is coupled to the output terminal of NOR logic gate NOR3. A source of NMOS transistor MN13 is coupled to the reference voltage supply VSS. A drain of NMOS transistor MN13 is coupled to the bit line bar BLB.

Other configurations, numbers of transistor or types of transistors in output circuit 430 are within the scope of the present disclosure.

Memory circuit 400 further includes a latch circuit 440.

Latch circuit 440 is coupled to the data line DL, the control signal generating circuit 402, switching circuit 406, pre-charge and equalization circuit 420, and the output circuit 430. Latch circuit 440 is configured to receive at least one of the sense amplifier enable signal SAE, the inverted sense amplifier enable signal SAEB or a data line signal of the data line DL. Latch circuit 440 is enabled or disabled responsive to at least one of the sense amplifier enable signal SAE or the inverted sense amplifier enable signal SAEB.

In some embodiments, during a read operation, latch circuit 440 is configured to latch the data line signal on the data line DL at node n2 in response to at least one of the sense amplifier enable signal SAE or the inverted sense amplifier enable signal SAEB. Latch circuit 440 includes an output node (e.g., node NO) that is configured to output signal Q.

Latch circuit 440 includes PMOS transistors MP7, MP8, MP9 and MP10, NMOS transistors MN7, MN8, MN9 and MN10, an inverter 14 and an inverter 15.

A source terminal of PMOS transistor MP7 is coupled to the voltage supply VDDM. Each of a gate of PMOS transistor MP7, a gate of NMOS transistor MN8 and the data line DL are coupled together. Each of the gate of PMOS transistor MP7 and the gate of NMOS transistor MN8 is configured to receive the data line signal on the data line DL. A drain of PMOS transistor MP7 is coupled to a source of PMOS transistor MP8.

A gate of PMOS transistor MP8 is coupled to the output terminal of inverter I1. The gate of PMOS transistor MP8 is configured to receive the inverted sense amplifier enable signal SAEB.

Each of a drain of PMOS transistor MP8, a drain of NMOS transistor MN7, a drain of PMOS transistor MP10, a drain of NMOS transistor MN9, an input terminal of inverter 14 and an input terminal of inverter 15 are coupled together. In some embodiments, the drain of PMOS transistor MP8 or the drain of NMOS transistor MN7 is configured to output an inverted output signal QB. In some embodiments, the drain of PMOS transistor MP10 or the drain of NMOS transistor MN9 is configured to output the inverted output signal QB.

A gate of NMOS transistor MN7 is coupled to the output terminal of inverter 12. The gate of NMOS transistor MN7 is configured to receive the sense amplifier enable signal SAE.

A source of NMOS transistor MN7 is coupled to a drain of NMOS transistor MN8. A source of NMOS transistor MN8 is coupled to the reference voltage supply VSS.

In some embodiments, when PMOS transistor MP8 and NMOS transistor MN7 are enabled or turned on, then PMOS transistor MP7 and NMOS transistor MN8 form an inverter (not labelled).

A source of PMOS transistor MP9 is coupled to the voltage supply VDDM. Each of a gate of PMOS transistor MP9, a gate of NMOS transistor MN10 and an output terminal of inverter I5 are coupled together. Each of the PMOS transistor MP9 and the gate of NMOS transistor MN10 is configured to receive an output signal Q1 from the output terminal of inverter IS. In some embodiments, the output signal Q1 corresponds to a feedback signal fed back to the gate of PMOS transistor MP9 and the gate of NMOS transistor MN10. In some embodiments, signal Q1 is inverted from the inverted output signal QB and vice versa. A drain of PMOS transistor MP9 is coupled to a source of PMOS transistor MP10.

A gate of PMOS transistor MP10 is coupled to the output terminal of inverter 12 and the gate of NMOS transistor MN7. The gate of PMOS transistor MP10 is configured to receive the sense amplifier enable signal SAE.

A gate of NMOS transistor MN9 is coupled to the output terminal of inverter I1 and the gate of PMOS transistor MP8. The gate of NMOS transistor MN9 is configured to receive the inverted sense amplifier enable signal SAEB.

A source of NMOS transistor MN9 is coupled to a drain of NMOS transistor MN10. A source of NMOS transistor MN10 is coupled to the reference voltage supply VSS.

In some embodiments, when PMOS transistor MP10 and NMOS transistor MN9 are enabled or turned on, then PMOS transistor MP9 and NMOS transistor MN10 form an inverter (not labelled).

Inverter 14 is configured to generate the output signal Q in response to the inverted output signal QB. The input terminal of inverter 14 is configured to receive the inverted output signal QB. An output terminal of inverter 14 is configured to output the output signal Q. In some embodiments, inverted output signal QB is inverted from signal Q and vice versa.

Inverter 15 is configured to generate the output signal Q1 in response to the inverted output signal QB. The input terminal of inverter 15 is configured to receive the inverted output signal QB. An output terminal of inverter 15 is configured to output the output signal Q1.

Other configurations, numbers of transistor or types of transistors in latch circuit 440 are within the scope of the present disclosure.

Memory circuit 400 further includes NMOS transistor MN11 and PMOS transistor MP11. A source of PMOS transistor MP11 is coupled to the voltage supply VDDM. A drain of PMOS transistor MP11 is electrically floating. A source of NMOS transistor MN11 is coupled to the reference voltage supply VSS. A drain of NMOS transistor MN11 is electrically floating.

Each of a gate of PMOS transistor MP11, a gate of NMOS transistor MN11, the source of PMOS transistor MP4, the drain of PMOS transistor MP5, the data line bar DLB, node n1, the drain of NMOS transistor MN5, the drain of PMOS transistor MP1, the drain of NMOS transistor MN1, the gate of PMOS transistor MP2, the gate of NMOS transistor MN2 and the first input terminal of NOR logic gate NOR3 are coupled together.

Each of the gate of PMOS transistor MP7, the gate of NMOS transistor MN8, the drain of PMOS transistor MP4, the drain of PMOS transistor MP6, the data line DL, node n2, the drain of NMOS transistor MN6, the drain of PMOS transistor MP2, the drain of NMOS transistor MN2, the gate of PMOS transistor MP1, the gate of NMOS transistor MN1 and the second input terminal of NOR logic gate NOR2 are coupled together.

Other configurations, numbers of transistor or types of transistors in PMOS transistor MP11 or NMOS transistor MN11 are within the scope of the present disclosure.

In some embodiments, memory circuit 400 operates to achieve one or more benefits described herein including the details discussed above with respect to memory circuit 100 or 200.

Other configurations of memory circuit 400 are within the scope of the present disclosure.

Figure 5:
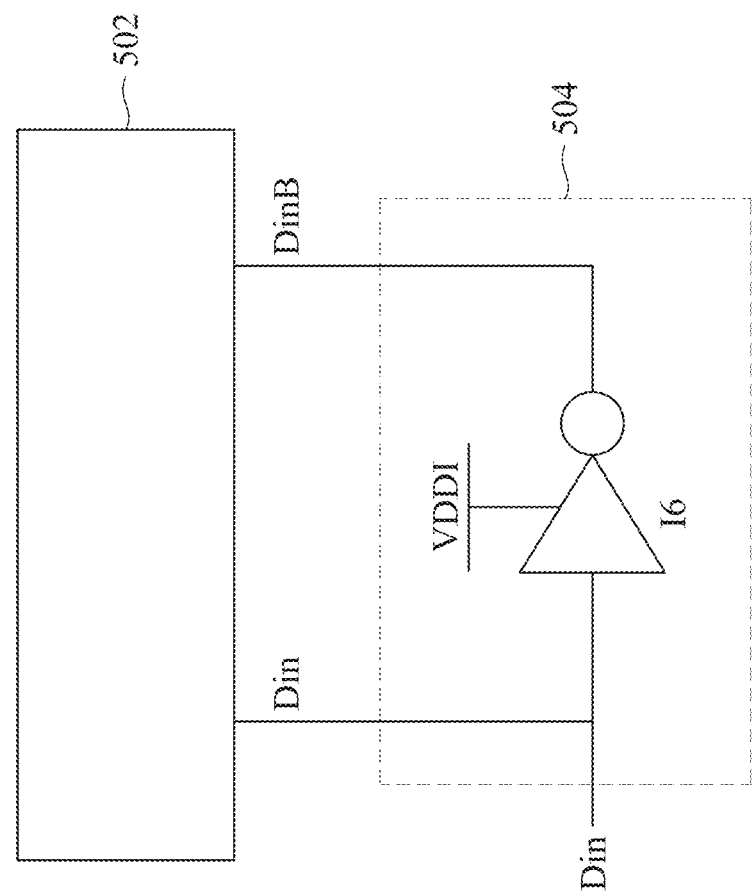
FIG. 5 is a circuit diagram of a memory circuit, in accordance with some embodiments.

FIG. 5 is a circuit diagram of a memory circuit 500, in accordance with some embodiments. Memory circuit 500 is a non-limiting example of an input circuit (e.g., input circuit 504) coupled to a memory circuit, such as memory circuit 400 of FIG. 4, and similar detailed description is therefore omitted.

Memory circuit 500 includes a memory circuit 502 coupled to an input circuit 504.

Figure 7:
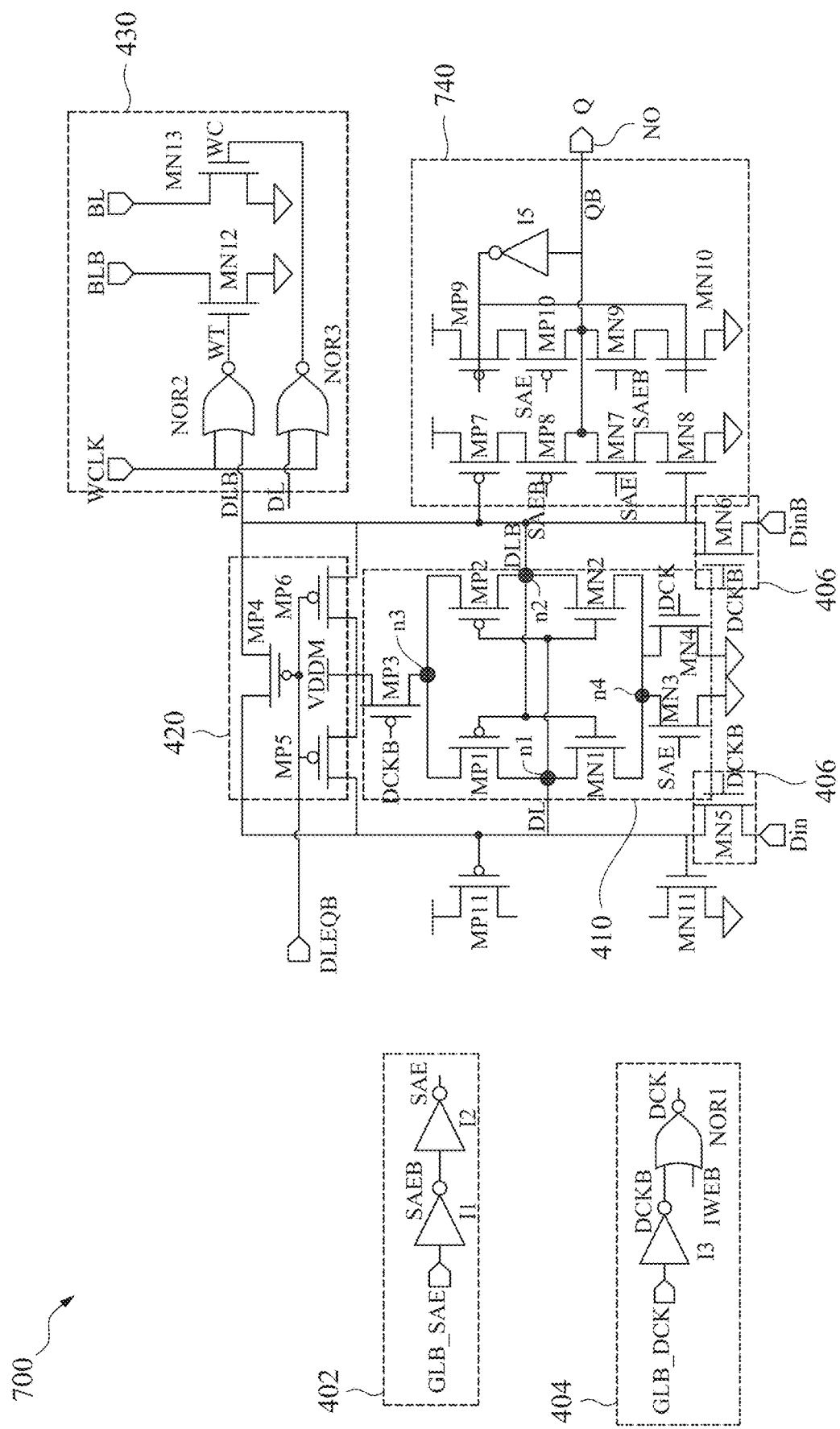
FIG. 7 is a circuit diagram of a memory circuit, in accordance with some embodiments.
Figure 8:
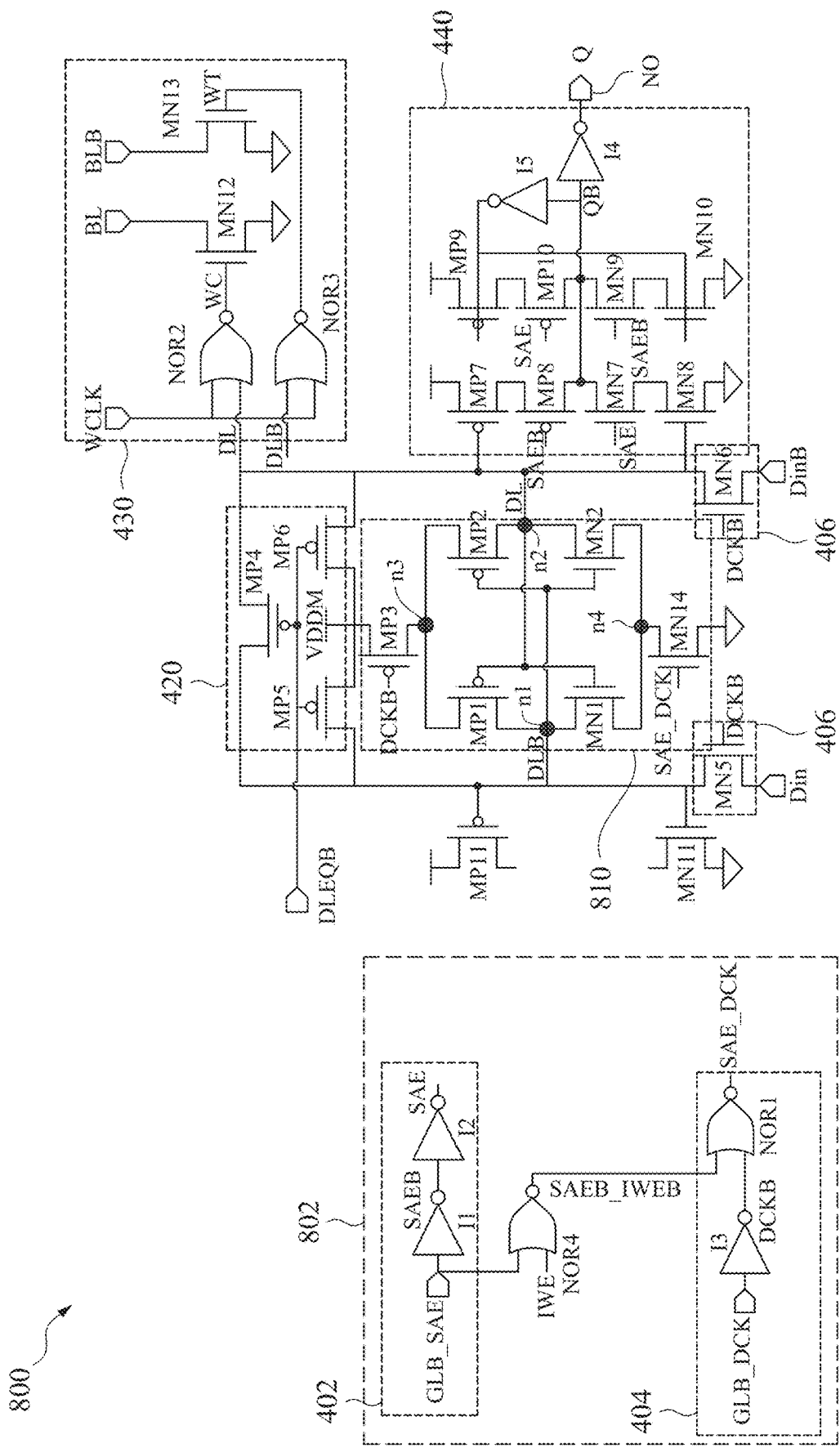
FIG. 8 is a circuit diagram of a memory circuit, in accordance with some embodiments.

In some embodiments, memory circuit 502 is at least one of sense amplifier circuit/write circuit 204 of FIG. 2, memory circuit 400 of FIG. 4, memory circuit 700 of FIG. 7 or memory circuit 800 of FIG. 8, and similar detailed description is therefore omitted.

Input circuit 504 is configured to receive the input signal Din. Input circuit 504 is configured to generate the input signal DinB in response to the input signal Din. In some embodiments, input signal DinB is inverted from input signal Din. In some embodiments, input circuit 504 is coupled to the switching circuit 406 in FIGS. 4, 7 and 8. Input circuit 504 includes an inverter I6.

Inverter I6 is configured to generate the input signal DinB in response to the input signal Din. An input terminal of inverter I6 is configured to receive the input signal Din. In some embodiments, the input terminal of inverter I6 is coupled to a source of input signal Din (not shown). The input terminal of inverter I6 is further coupled to memory circuit 502. An output terminal of inverter I6 is coupled to memory circuit 502. The output terminal of inverter I6 is configured to output the input signal DinB to memory circuit 502. In some embodiments, inverter I6 is coupled to the switching circuit 406 in FIGS. 4, 7 and 8. Inverter I6 is further coupled to a supply voltage VDDI. In some embodiments, input signal Din and DinB are part of a voltage domain (e.g., VDDI) that is different from a voltage domain (e.g., VDDM) of memory circuit 400, 700 and 800. In some embodiments, supply voltage VDDI has a different voltage swing from supply voltage VDDM. In some embodiments, input signals Din and DinB are part of a voltage domain (e.g., VDDI) that is the same as a voltage domain (e.g., VDDM) of memory circuit 400, 700 and 800. In some embodiments, supply voltage VDDI has a same voltage swing as supply voltage VDDM.

Other configurations, other types of circuit elements or numbers of circuit elements in input circuit 504, inverter I6 or memory circuit 500 are within the scope of the present disclosure.

In some embodiments, memory circuit 500 operates to achieve one or more benefits described herein including the details discussed above with respect to memory circuit 100 or 200.

Other configurations of memory circuit 500 are within the scope of the present disclosure.

Waveforms

Figure 6:
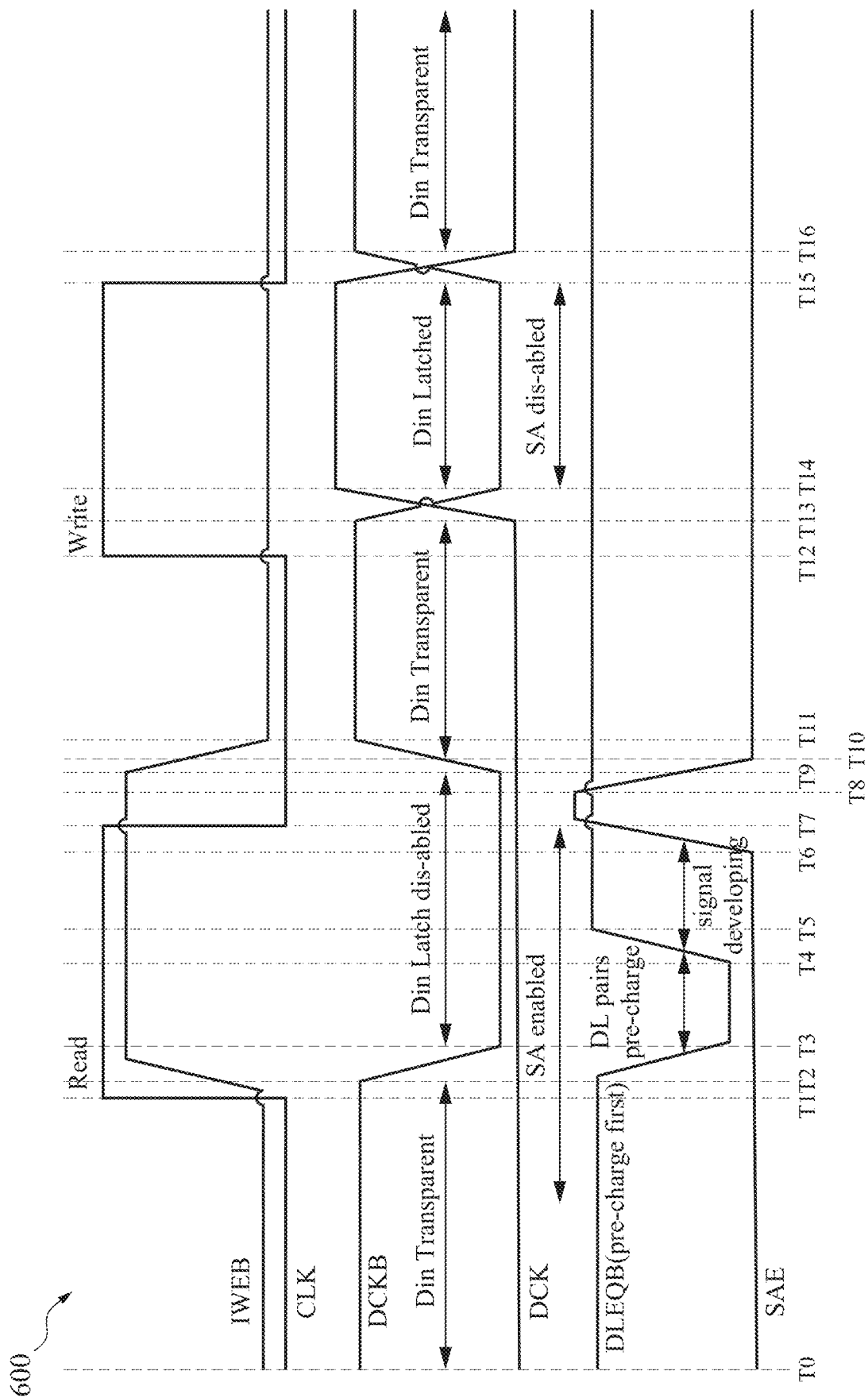
FIG. 6 is a timing diagram of waveforms of a memory circuit, such as the memory circuit in FIG. 2, the memory circuit in FIG. 4, the memory circuit in FIG. 5 or the memory circuit in FIG. 7, in accordance with some embodiments.

FIG. 6 is a timing diagram 600 of waveforms of a memory circuit, such as memory circuit 200 in FIG. 2, memory circuit 400 in FIG. 4, memory circuit 500 in FIG. 5, memory circuit 700 in FIG. 7, in accordance with some embodiments. In some embodiments, FIG. 6 is a timing diagram 600 of at least memory circuits 100-200, memory circuit 400, memory circuit 500 or memory circuit 700 of FIG. 7, in accordance with some embodiments.

In some embodiments, one or more read operations and write operations of the memory banks in at least memory circuit 100 of FIG. 1 are applied to at least one of memory partition 102A, 102B, 102C or 102D, and timing diagram 600 corresponds to waveforms during the read operations and write operations of at least one of memory partition 102A, 102B, 102C or 102D.

In some embodiments, one or more read operations and write operations are applied to at least one memory cell in column 0 of memory cell array 202 in at least memory circuit 200 of FIG. 2, and timing diagram 600 corresponds to waveforms during the read operations and write operations of the at least one memory cell in column 0 of memory cell array 202 in at least memory circuit 200 of FIG. 2.

Timing diagram 600 includes waveforms of the control signal IWEB, a clock signal CLK, the control signal DCKB, the control signal DCK, the signal DLEQB and the sense amplifier enable signal SAE.

At time T0, the control signal IWEB is logically low, the clock signal CLK is logically low, the control signal DCKB is logically high, the control signal DCK is logically low, the signal DLEQB is logically high and the sense amplifier enable signal SAE is logically low.

Figure 9:
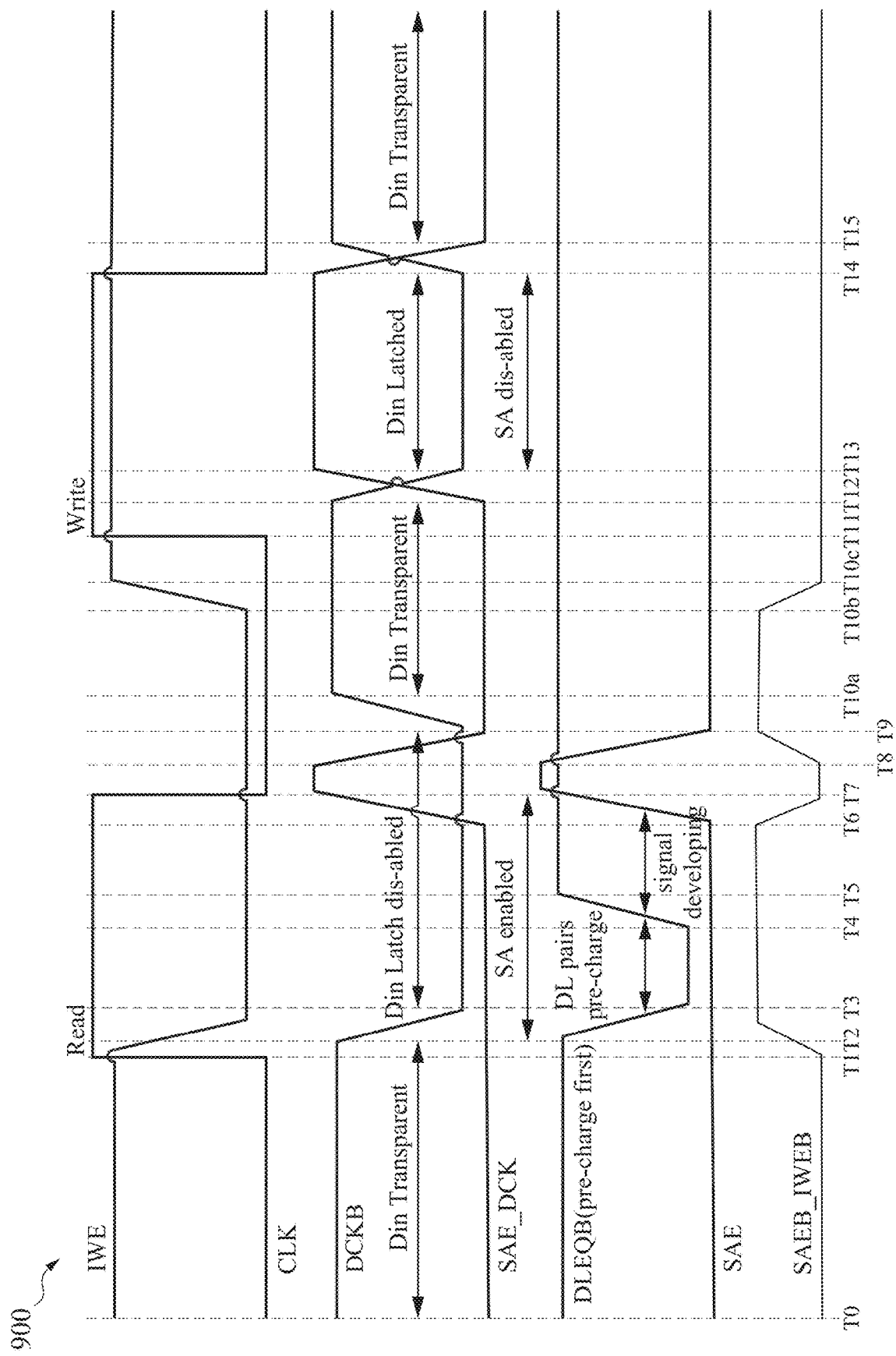
FIG. 9 is a timing diagram of waveforms of a memory circuit, such as the memory circuit in FIG. 8, in accordance with some embodiments.

At time T0, in response to the control signal DCKB being logically high, the switching circuit 406 is turned on, and the latch circuit 410 is transparent and is labelled as "Din Transparent" in FIGS. 6 and 9. For example, at time T0, in response to the control signal DCKB being logically high, the NMOS transistors MN5 and MN6 are turned on, thereby coupling the data signal Din and DinB to the corresponding data line DL and data line bar DLB.

Between time T1 and time T7, a read operation is performed on the memory cell.

At time T1, the clock signal CLK and the control signal IWEB transition from logically low to logically high. In response to at least the transition from logically low to logically high of the clock signal CLK, causes a read operation of the memory cell.

At time T2, the control signal DCKB and the signal DLEQB transition from logically high to logically low.

Between time T2 and T3, the control signal IWEB is logically high.

At time T3, the control signal DCKB is logically low thereby causing PMOS transistor MP3 to turn on, and causing the switching circuit 406 to turn off, and the latch circuit 410 is disabled and is labelled as "Din Latch Disabled" in FIGS. 6 and 9. For example, at time T3, in response to the control signal DCKB being logically low, the NMOS transistors MN5 and MN6 are turned off, thereby decoupling the data signal Din and DinB from the corresponding data line DL and data line bar DLB.

At time T3, the signal DLEQB is logically low thereby causing pre-charge and equalization circuit 420 to be enabled. For example, at time T3, in response to the signal DLEQB being logically low, the PMOS transistor MP4 is turned on, thereby coupling the data line DL and the data line bar DLB together, and the PMOS transistors MP5 and MP6 are turned on, thereby connecting the data line DL and the data line bar DLB to the supply voltage VDDM, and pre-charging the data line DL and the data line bar DLB to the pre-charge voltage (e.g., voltage VDL).

At time T4, the signal DLEQB transitions from logically low to logically high. In some embodiments, the signal DLEQB transitions from logically low to logically high at time T4 since the data line DL and the data line bar DLB have been sufficiently charged to the pre-charge voltage (e.g., voltage VDL).

At time T5, the signal DLEQB is logically high thereby causing pre-charge and equalization circuit 420 to be disabled. For example, at time T5, in response to the signal DLEQB being logically high, the PMOS transistor MP4 is turned off, thereby decoupling the data line DL and the data line bar DLB from each other, and the PMOS transistors MP5 and MP6 are turned off, thereby disconnecting the data line DL and the data line bar DLB from the supply voltage VDDM.

At time T6, the sense amplifier enable signal SAE transitions from logically low to logically high. In some embodiments, the sense amplifier enable signal SAE transitions from logically low to logically high at time T6 since sufficient time has passed to allow the split between the data line signal on the data line DL and the data line bar signal on the data line bar DLB to sufficiently develop.

At time T7, the sense amplifier enable signal SAE is logically high thereby causing latch circuit 410 to be enabled. In some embodiments, when the sense amplifier enable signal SAE is logically high, the inverted sense amplifier enable signal SAEB is logically low. For example, at time T7, in response to the sense amplifier enable signal SAE being logically high, the NMOS transistor MN3 is turned on, and thereby pulling the data line signal (e.g., node n2) on the data line DL or the data line bar signal (e.g., node n1) on the data line bar DLB towards the reference supply voltage VSS. In some embodiments, the node of node n1 or node n2 that is pulled logically low is the node that has a lower voltage level.

At time T7, the sense amplifier enable signal SAE is logically high thereby causing the latch (e.g., inverter 15, PMOS transistors MP9-MP10 and NMOS transistors MN9-MN10) within latch circuit 440 to be disabled, and to transfer the data line signal from the data line DL to the output node NO. For example, at time T7, in response to the sense amplifier enable signal SAE being logically high, the NMOS transistor MN7 is turned on and the PMOS transistor MP10 is turned off, and in response to the inverted sense amplifier enable signal SAEB being logically low, the PMOS transistor MP8 is turned on and the NMOS transistor MN9 is turned off, thereby causing PMOS transistor MP7 and NMOS transistor MN8 to set the output signal QB. In some embodiments, the output signal QB is inverted from the data line signal on the data line DL. Afterwards, inverter 14 is configured to invert the output signal QB in setting the output signal Q, which corresponds to the data value read from the memory cell in the read operation.

At time T7, the clock signal CLK transitions from logically high to logically low. In response to the clock signal CLK transitioning to logically low causes the end of the read operation of the memory cell.

At time T8, the sense amplifier enable signal SAE transitions from logically high to logically low. In some embodiments, the sense amplifier enable signal SAE transitions from logically high to logically low at time T8 since sufficient time has passed to transfer or pass the data line signal from the data line DL to the output node NO.

At time T9, the control signal IWEB transitions from logically high to logically low, and the control signal DCKB transitions from logically low to logically high.

At time T10, the sense amplifier enable signal SAE is logically low thereby causing latch circuit 410 to be disabled. In some embodiments, when the sense amplifier enable signal SAE is logically low, the inverted sense amplifier enable signal SAEB is logically high. For example, at time T10, in response to the sense amplifier enable signal SAE being logically low, the NMOS transistor MN3 is turned off, and node n4 is disconnected from the reference voltage supply VSS.

At time T10, the sense amplifier enable signal SAE is logically low thereby causing the latch (e.g., inverter 15, PMOS transistors MP9-MP10 and NMOS transistors MN9-MN10) within latch circuit 440 to be enabled, and the data line signal is no longer transferred from the data line DL to the output node NO. For example, at time T10, in response to the sense amplifier enable signal SAE being logically low, the NMOS transistor MN7 is turned off and the PMOS transistor MP10 is turned on, and in response to the inverted sense amplifier enable signal SAEB being logically high, the PMOS transistor MP8 is turned off and the NMOS transistor MN9 is turned on, thereby causing at least inverter IS, PMOS transistor MP9 and NMOS transistor MN10 to latch the output signal QB. After time T10, the output signal QB is latched by latch circuit 440 during the subsequent write operation of the memory cell. After time T10, inverter 14 is configured to invert the output signal QB in setting the output signal Q, which corresponds to the data value read from the memory cell in the read operation.

At time T11, the control signal IWEB is logically low. At time T11, the control signal DCKB is logically high thereby causing the switching circuit 406 to be turned on, and the latch circuit 410 is transparent. For example, at time T11, in response to the control signal DCKB being logically high, the NMOS transistors MN5 and MN6 are turned on, thereby coupling the data signal Din and DinB to the corresponding data line DL and data line bar DLB.

Between time T12 and time T15, a write operation is performed on the memory cell.

At time T12, the clock signal CLK transitions from logically low to logically high thereby causing a write operation of the memory cell.

At time T13, the control signal DCKB transitions from logically high to logically low. In response to the transition of the control signal DCKB from logically high to logically low, and the control signal IWEB being logically low causes control signal DCK to transition from logically low to logically high by the NOR logic gate NOR1.

At time T14, the control signal DCKB is logically low thereby causing PMOS transistor MP3 to turn on, and causing the switching circuit 406 to turn off, and the control signal DCK is logically high thereby causing NMOS transistor MN4 to turn on, and the latch circuit 410 is enabled and is labelled as "Din Latched" in FIGS. 6 and 9. For example, at time T14, in response to the control signal DCKB being logically low, the NMOS transistors MN5 and MN6 are turned off, thereby decoupling the data signal Din and DinB from the corresponding data line DL and data line bar DLB. However, since the latch circuit 410 is enabled, the latch circuit 410 latches the input data (e.g., input data signal Din and DinB) even though the data line DL and the data line bar DLB are disconnected from the source of the data signals Din and DinB.

At time T14, the control signal WCLK is logically low, one of either the data line DL or data line bar DLB is logically low thereby causing the corresponding NOR logic gate NOR2 or NOR3 to output corresponding signal WC or WT as a logically high. In response to signal WC or WT as a logically high causes corresponding NMOS transistor MN12 or MN13 to turn on, thereby causing the corresponding NMOS transistor MN12 or MN13 to discharge the corresponding bit line BL or bit line bar BLB to logically low (which is the state of the DL or DLB for the write operation).

At time T15, the clock signal CLK transitions from logically high to logically low thereby ending the write operation of the memory cell. At time T15, the control signal DCKB transitions from logically low to logically high thereby causing the control signal DCK to transition from logically high to logically low by the NOR logic gate NOR1.

At time T16, the control signal DCKB is logically high, and the control signal DCK is logically low. At time T16, the control signal DCK is logically low thereby causing NMOS transistor MN4 to turn off. At time T16 and afterwards is similar to time T0, and similar detailed description is therefore omitted.

In some embodiments, timing diagram 600 causes at least memory circuit 400 or 700 to achieve one or more benefits described herein including the details discussed above with respect to memory circuit 100 or 200. In some embodiments, timing diagram 600 matches an NAP design.

In some embodiments, while timing diagram 600 is described with respect to memory circuit 400, timing diagram 600 is also applicable to memory circuit 700 in a similar manner, and is not described for brevity.

Other configurations of timing diagram 600 are within the scope of the present disclosure.

Memory Circuit

FIG. 7 is a circuit diagram of a memory circuit 700, in accordance with some embodiments.

Memory circuit 700 is a variation of memory circuit 400 of FIG. 4, and similar detailed description is therefore omitted. For example, memory circuit 700 illustrates a non-limiting example where the data line DL and the data line bar DLB in FIG. 7 are flipped in comparison with the corresponding data line DL and the corresponding data line bar DLB in memory circuit 400 of FIG. 4, and similar detailed description is therefore omitted.

Memory circuit 700 includes control signal generating circuit 402, control signal generating circuit 404, latch circuit 410, pre-charge and equalization circuit 420, output circuit 430 and latch circuit 740.

In comparison with memory circuit 400 of FIG. 4, latch circuit 740 of FIG. 7 replaces latch circuit 440, and similar detailed description is therefore omitted. In comparison with latch circuit 440 of FIG. 4, latch circuit 740 of FIG. 7 does not include inverter 14, and output signal QB in FIG. 7 is the same as output signal Q in FIG. 7, and similar detailed description is therefore omitted.

In FIG. 7, each of the data line DL, node n1, the gate of PMOS transistor MP11, the gate of NMOS transistor MN11, the source of PMOS transistor MP4, the drain of PMOS transistor MP5, the drain of NMOS transistor MN5, the drain of PMOS transistor MP1, the drain of NMOS transistor MN1, the gate of PMOS transistor MP2, the gate of NMOS transistor MN2 and the first input terminal of NOR logic gate NOR3 are coupled together.

In FIG. 7, each of the data line bar DLB, node n2, the gate of PMOS transistor MP7, the gate of NMOS transistor MN8, the drain of PMOS transistor MP4, the drain of PMOS transistor MP6, the drain of NMOS transistor MN6, the drain of PMOS transistor MP2, the drain of NMOS transistor MN2, the gate of PMOS transistor MP1, the gate of NMOS transistor MN1 and the second input terminal of NOR logic gate NOR2 are coupled together.

In some embodiments, memory circuit 700 operates to achieve one or more benefits described herein including the details discussed above with respect to memory circuit 100, 200 or 400.

Other configurations of memory circuit 700 are within the scope of the present disclosure. In some embodiments, operation of memory circuit 700 is the same as the operation of memory circuit 400, and therefore the timing diagram 600 of FIG. 6 is also applicable to memory circuit 700, and is not described for brevity.

FIG. 8 is a circuit diagram of a memory circuit 800, in accordance with some embodiments. Memory circuit 800 is a variation of memory circuit 400 of FIG. 4, and similar detailed description is therefore omitted. For example, memory circuit 800 illustrates a non-limiting example where an NMOS transistor MN 14 replaces NMOS transistors MN3 and MN4 in memory circuit 400 of FIG. 4, and similar detailed description is therefore omitted.

Memory circuit 800 includes a control signal generating circuit 802, a latch circuit 810, pre-charge and equalization circuit 420, output circuit 430 and latch circuit 440.

In comparison with memory circuit 400 of FIG. 4, latch circuit 810 of FIG. 8 replaces latch circuit 410, and similar detailed description is therefore omitted. In comparison with latch circuit 410 of FIG. 4, NMOS transistor MN 14 of latch circuit 810 of FIG. 8 replaces NMOS transistors MN3 and MN4 of latch circuit 410 in FIG. 4, and similar detailed description is therefore omitted.

Each of a drain of NMOS transistor MN14, the source of NMOS transistor MN1 and the source of NMOS transistor MN2 are coupled together at node n4. A source of NMOS transistor MN14 is configured as a supply reference voltage node (not labelled) having a supply reference voltage VSS. A gate of NMOS transistor MN14 is configured to receive a control signal SAE_DCK. In some embodiments, the control signal SAE_DCK is combination of the sense amplifier enable signal SAE and control signal DCKB. The gate of NMOS transistor MN14 is coupled to the output terminal of NOR logic gate NOR1 of control signal generating circuit 802. In some embodiments, NMOS transistor MN14 is referred to as a "footer switch."

In comparison with memory circuit 400 of FIG. 4, control signal generating circuit 802 of FIG. 8 includes control signal generating circuit 402 and control signal generating circuit 404 of FIG. 4 coupled together, and similar detailed description is therefore omitted. For example, by coupling together control circuit 402 and control circuit 404, control circuit 802 generates a control signal SAE_DCK rather than control signal DCK, and similar detailed description is therefore omitted.

Control signal generating circuit 802 includes the control signal generating circuit 402, the control signal generating circuit 404 and a NOR logic gate NOR4.

In comparison with control signal generating circuit 402 of FIG. 4, the input terminal of inverter I1 of control signal generating circuit 402 of FIG. 8 is further coupled to a first input terminal of NOR logic gate NOR4, and similar detailed description is therefore omitted.

The first input terminal of NOR logic gate NOR4 is configured to receive the global sense amplifier enable signal GLB_SAE. A second input terminal of NOR logic gate NOR4 is configured to receive a control signal IWE. In some embodiments, control signal IWE is a write enable signal that is configured as a logic 0 during a read operation of one or more memory cells coupled to memory circuit 800. In some embodiments, control signal IWE is a write enable signal that is configured as a logic 1 during a write operation of one or more memory cells coupled to memory circuit 800. In some embodiments, control signal IWE is generated by an external circuit (not shown). In some embodiments, control signal generating circuit 802 is coupled to GIO circuit 100BL in FIG. 1, and is configured to receive the global sense amplifier enable signal GLB_SAE from the GIO circuit 100BL in FIG. 1. In some embodiments, the second input terminal of NOR logic gate NOR4 is directly coupled to a source (not shown) of the control signal IWE. An output terminal of NOR logic gate NOR4 is configured to output a control signal SAEB_IWEB. NOR logic gate NOR4 is configured to generate the control signal SAEB_IWEB based on the global sense amplifier enable signal GLB_SAE and the control signal IWE. The output terminal of NOR logic gate NOR4 is coupled to the control signal generating circuit 404 of FIG. 8.

In comparison with control signal generating circuit 404 of FIG. 4, the second input terminal of NOR logic gate NOR1 of control signal generating circuit 404 of FIG. 8 is coupled to the output terminal of NOR logic gate NOR4, and similar detailed description is therefore omitted.

NOR logic gate NOR1 of FIG. 8 is configured to generate the control signal SAE_DCK based on the control signal DCKB and the control signal SAEB_IWEB. The output terminal of NOR logic gate NOR1 of FIG. 8 is configured to output the control signal SAE_DCK. The output terminal of NOR logic gate NOR1 of FIG. 8 is coupled to the gate of NMOS transistor MN14 of latch circuit 810. In some embodiments, the control signal SAE_DCK is combination of the sense amplifier enable signal SAE and control signal DCKB.

In some embodiments, memory circuit 800 operates to achieve one or more benefits described herein including the details discussed above with respect to memory circuit 100, 200 or 400. In some embodiments, operation of memory circuit 800 is similar to operation of memory circuit 400, and the same description is omitted for brevity. For example, the data signal Q for memory circuit 800 is the same as the data signal Q for memory circuit 400 or 700 for the read operation, in accordance with some embodiments. For example, signals WC and WT for memory circuit 800 are the same as corresponding signals WC and signal WT for memory circuit 400 or 700 for the read operation, in accordance with some embodiments. In some embodiments, operation of memory circuit 800 is described in FIG. 9 (below).

Other configurations of memory circuit 800 are within the scope of the present disclosure.

Waveforms

FIG. 9 is a timing diagram 900 of waveforms of a memory circuit, such as memory circuit 800 in FIG. 8, in accordance with some embodiments. In some embodiments, FIG. 9 is a timing diagram 900 of at least memory circuit 100-200, or memory circuit 500, in accordance with some embodiments.

In some embodiments, one or more read operations and write operations of the memory banks in at least memory circuit 100 of FIG. 1 are applied to at least one of memory partition 102A, 102B, 102C or 102D, and timing diagram 900 corresponds to waveforms during the read operations and write operations of at least one of memory partition 102A, 102B, 102C or 102D.

In some embodiments, one or more read operations and write operations are applied to at least one memory cell in column 0 of memory cell array 202 in at least memory circuit 200 of FIG. 2, and timing diagram 900 corresponds to waveforms during the read operations and write operations of the at least one memory cell in column 0 of memory cell array 202 in at least memory circuit 200 of FIG. 2.

Timing diagram 900 includes waveforms of the control signal IWE, clock signal CLK, the control signal DCKB, the control signal SAE_DCK, the signal DLEQB and the sense amplifier enable signal SAE.

At time T0, the control signal IWE is logically high, the clock signal CLK is logically low, the control signal DCKB is logically high, the control signal SAE_DCK is logically low, the signal DLEQB is logically high, the sense amplifier enable signal SAE is logically low, and control signal SAEB_IWEB is logically low.

At time T0, in response to the control signal DCKB being logically high, the switching circuit 406 is turned on, and the latch circuit 810 is transparent and is labelled as "Din Transparent." At time T0 in FIG. 9 is similar to time T0 in FIG. 6, and similar detailed description is therefore omitted.

Between time T1 and time T7, a read operation is performed on the memory cell. At time T1, the clock signal CLK transitions from logically low to logically high thereby causing a read operation of the memory cell.

At time T1, the control signal IWE transitions from logically high to logically low thereby causing the control signal SAEB_IWEB to transition from logically low to logically high.

At time T2, the control signal DCKB and the signal DLEQB transition from logically high to logically low.

Between time T2 and T3, the control signal IWE is logically low, and the control signal SAEB_IWEB is logically high.

At time T3, the control signal DCKB is logically low thereby causing PMOS transistor MP3 to turn on, and causing the switching circuit 406 to turn off, and the latch circuit 810 is disabled and is labelled as "Din Latch Disabled" in FIGS. 6 and 9.

At time T3, the signal DLEQB is logically low thereby causing pre-charge and equalization circuit 420 to be enabled. At time T3 in FIG. 9 is similar to time T3 in FIG. 6, and similar detailed description is therefore omitted.

At time T4, the signal DLEQB transitions from logically low to logically high. At time T4 in FIG. 9 is similar to time T4 in FIG. 6, and similar detailed description is therefore omitted.

At time T5, the signal DLEQB is logically high thereby causing pre-charge and equalization circuit 420 to be disabled. At time T5 in FIG. 9 is similar to time T5 in FIG. 6, and similar detailed description is therefore omitted.

At time T6, the sense amplifier enable signal SAE transitions from logically low to logically high thereby causing the control signal SAEB_IWEB to transition from logically high to logically low by the NOR logic gate NOR4, thereby causing the control signal SAE_DCK to transition from logically low to logically high by the NOR logic gate NOR1.

At time T7, the control signal SAE_DCK is logically high thereby causing latch circuit 810 to be enabled. For example, at time T7, in response to the control signal SAE_DCK being logically high, the NMOS transistor MN14 is turned on, and thereby pulling the data line signal (e.g., node n2) on the data line DL or the data line bar signal (e.g., node n1) on the data line bar DLB towards the reference supply voltage VSS. In some embodiments, the node of node n1 or node n2 that is pulled logically low is the node that has a lower voltage level.

At time T7, the sense amplifier enable signal SAE is logically high thereby causing the latch (e.g., inverter 15, PMOS transistors MP9-MP10 and NMOS transistors MN9-MN10) within latch circuit 440 to be disabled, and to transfer the data line signal from the data line DL to the output node NO similar to time T7 in FIG. 6, and similar detailed description is therefore omitted.

At time T7, the clock signal CLK transitions from logically high to logically low. In response to the clock signal CLK transitioning to logically low causes the end of the read operation of the memory cell.

At time T7, the control signal SAEB_IWEB is logically low.

At time T8, the sense amplifier enable signal SAE transitions from logically high to logically low thereby causing the control signal SAEB_IWEB to transition from logically low to logically high by the NOR logic gate NOR4, thereby causing the control signal SAE_DCK to transition from logically high to logically low by the NOR logic gate NOR1.

At time T8, the sense amplifier enable signal SAE transitioning from logically high to logically low is similar to time T8 in FIG. 6, and similar detailed description is therefore omitted.

At time T9, the control signal SAE_DCK is logically low thereby causing latch circuit 810 to be disabled. For example, at time T9, in response to the control signal SAE_DCK being logically low, the NMOS transistor MN14 is turned off, and node n4 is disconnected from the reference voltage supply VSS.

At time T9, the sense amplifier enable signal SAE is logically low thereby causing the latch (e.g., inverter 15, PMOS transistors MP9-MP10 and NMOS transistors MN9-MN10) within latch circuit 440 to be enabled, and the data line signal is no longer transferred from the data line DL to the output node NO, and is similar to time T10 in FIG. 6, and similar detailed description is therefore omitted.

At time T9, the control signal SAE_DCK is logically low, and the control signal SAEB_IWEB is logically high.

At time T9, the control signal DCKB transitions from logically low to logically high.

At time T10a, the control signal DCKB is logically high thereby causing the switching circuit 406 to be turned on, and the latch circuit 810 is transparent, and is similar to time T11 in FIG. 6, and similar detailed description is therefore omitted.

At time T10b, the control signal IWE transitions from logically low to logically high thereby causing the control signal SAEB_IWEB to transition from logically high to logically low.

At time T10c, the control signal IWE is logically high, and the control signal SAEB_IWEB is logically low.

Between time T11 and time T14, a write operation is performed on the memory cell. At time T11, the clock signal CLK transitions from logically low to logically high thereby causing a write operation of the memory cell.

At time T12, the control signal DCKB transitions from logically high to logically low. In response to the transition of the control signal DCKB from logically high to logically low, and the control signal SAEB_IWEB being logically low causes control signal SAE_DCK to transition from logically low to logically high by the NOR logic gate NOR1 thereby causing latch circuit 810 to be enabled.

At time T13, the control signal SAE_DCK is logically high thereby causing latch circuit 810 to be enabled. For example, at time T13, in response to the control signal SAE_DCK being logically high, the NMOS transistor MN14 is turned on, and thereby pulling the data line signal (e.g., node n2) on the data line DL or the data line bar signal (e.g., node n1) on the data line bar DLB towards the reference supply voltage VSS.

At time T13, the control signal DCKB is logically low thereby causing PMOS transistor MP3 to turn on, and causing the switching circuit 406 to turn off, and the latch circuit 810 is enabled, and is similar to time T14 in FIG. 6, and similar detailed description is therefore omitted.

At time T13, the control signal WCLK is logically low, and is similar to time T14 in FIG. 6, and similar detailed description is therefore omitted.

At time T14, the control signal DCKB transitions from logically low to logically high. In response to the transition of the control signal DCKB from logically low to logically high, and the control signal SAEB_IWEB being logically low causes control signal SAE_DCK to transition from logically high to logically low by the NOR logic gate NOR1.

At time T14, the clock signal CLK transitions from logically high to logically low thereby ending the write operation of the memory cell.

At time T15, the control signal DCKB is logically high, and the control signal SAE_DCK is logically low.

At time T15, the control signal SAE_DCK is logically low thereby causing NMOS transistor MN14 to turn off. At time T15 and afterwards is similar to time T0, and similar detailed description is therefore omitted.

In some embodiments, timing diagram 900 causes at least memory circuit 500 or 800 to achieve one or more benefits described herein including the details discussed above with respect to memory circuit 100 or 200.

Other configurations of timing diagram 900 are within the scope of the present disclosure.

Figure 10A:
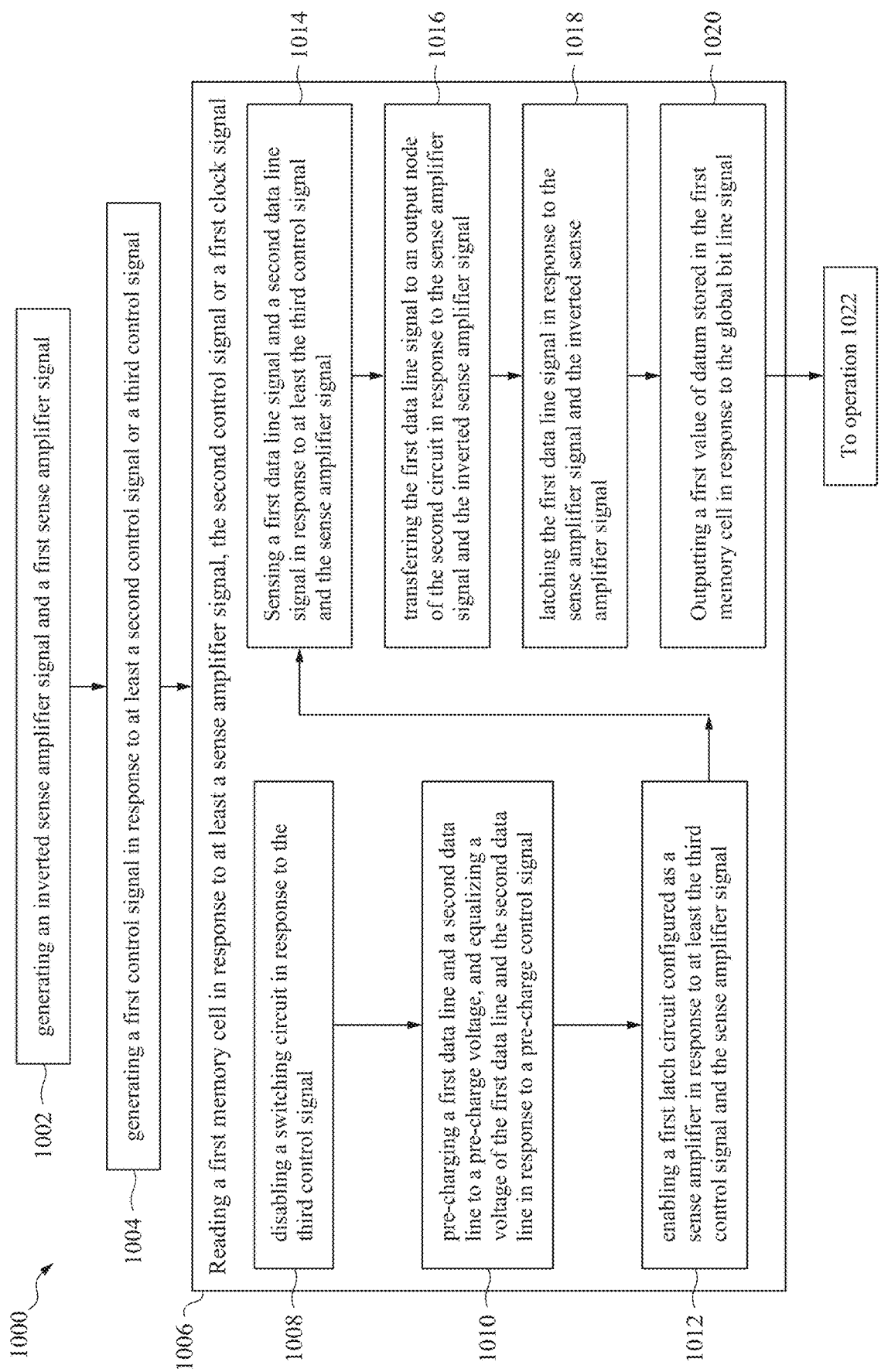
FIGS. 10A-10B are a flowchart of a method of operating a circuit, in accordance with some embodiments.
Figure 10B:
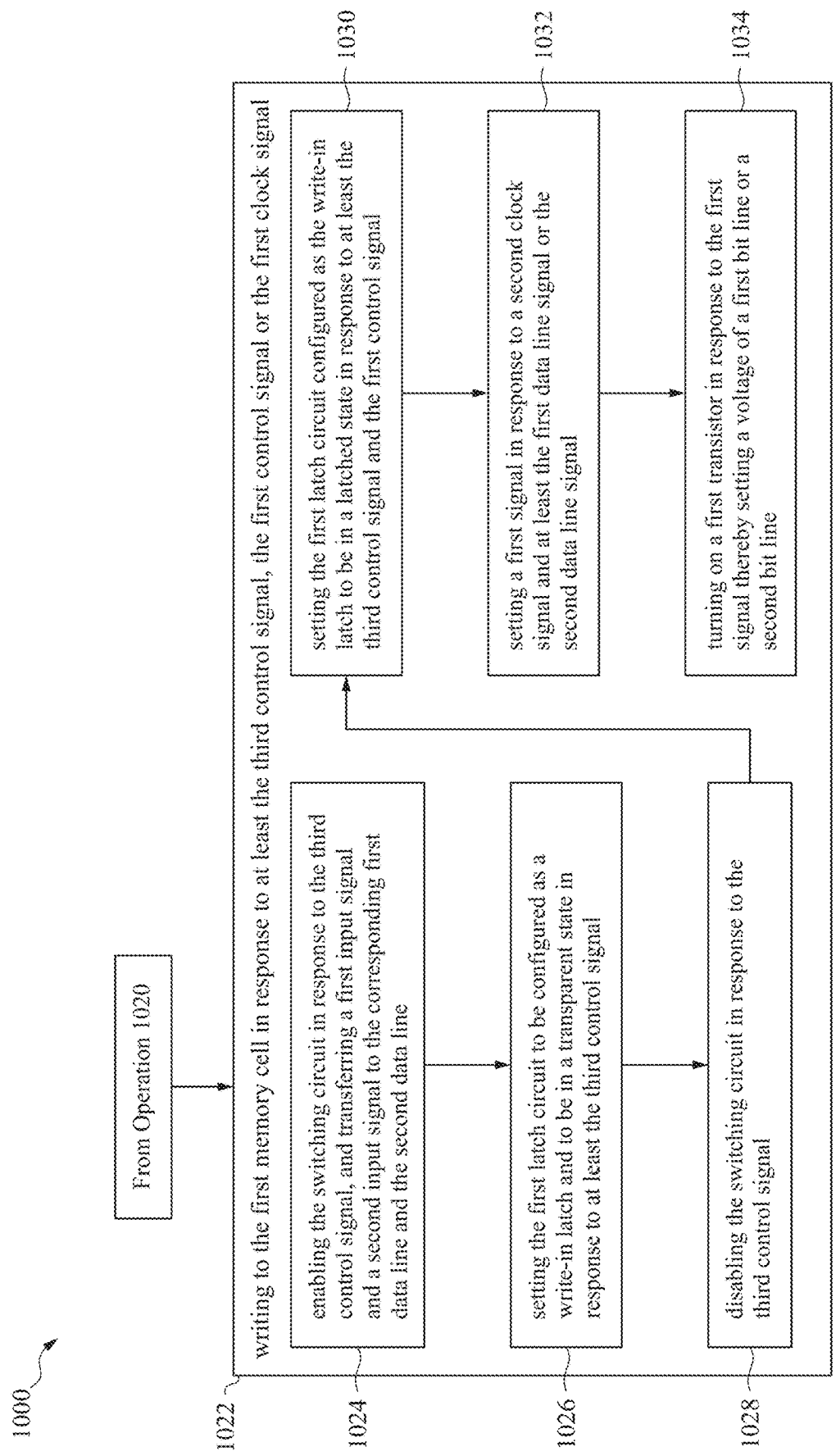

Method:

FIGS. 10A-10B are a flowchart of a method 1000 of operating a circuit, in accordance with some embodiments.

In some embodiments, FIGS. 10A-10B are flowcharts of a method 1000 of operating at least one of memory circuit 100 of FIG. 1, memory circuit 200 of FIG. 2, memory circuit 400 of FIG. 4, memory circuit 500 of FIG. 5, memory circuit 700 of FIG. 7, or memory circuit 800 of FIG. 8 or memory cell 300 of FIG. 3.

In some embodiments, FIGS. 10A-10B are flowcharts of a method 1000 of operating a memory circuit, and the method 1000 includes the features of timing diagrams 600 of FIG. 6 and timing diagram 900 of FIG. 9, and similar detailed description is omitted for brevity.

It is understood that additional operations may be performed before, during, and/or after the method 1000 depicted in FIGS. 10A-10B, and that some other operations may only be briefly described herein. It is understood that method 1000 utilizes features of one or more of at least one of memory circuit 100 of FIG. 1, memory circuit 200 of FIG. 2, memory circuit 400 of FIG. 4, memory circuit 500 of FIG. 5, memory circuit 700 of FIG. 7, or memory circuit 800 of FIG. 8 or memory cell 300 of FIG. 3, and similar detailed description is omitted for brevity.

In some embodiments, other order of operations of method 1000 is within the scope of the present disclosure. Method 1000 includes exemplary operations, but the operations are not necessarily performed in the order shown. Operations may be added, replaced, changed order, and/or eliminated as appropriate, in accordance with the spirit and scope of disclosed embodiments. In some embodiments, one or more of the operations of method 1000 is not performed.

In operation 1002 of method 1000, an inverted sense amplifier signal SAEB and a sense amplifier signal SAE are generated.

In some embodiments, operation 1002 is performed by a first control circuit. In some embodiments, the first control circuit includes control signal generating circuit 402.

In operation 1004 of method 1000, at least a first control signal is generated. In some embodiments, the first control signal is generated in response to at least a second control signal or a third control signal.

In some embodiments, the first control signal includes at least one of control signal DCK or control signal SAE_DCK. In some embodiments, the second control signal includes at least one of control signal IWEB, control signal IWE, or control signal SAEB_IWEB. In some embodiments, the third control signal includes control signal DCKB.

In some embodiments, operation 1004 is performed by a second control circuit. In some embodiments, the second control circuit includes at least one of control signal generating circuit 404 or NOR logic gate NOR4. In some embodiments, the second control circuit includes control signal generating circuit 802.

In operation 1006 of method 1000, a first memory cell is read in response to at least the sense amplifier signal, the second control signal or a first clock signal. In some embodiments, the first memory cell is read by an LIO circuit. In some embodiments, the LIO circuit includes memory circuit 200, memory circuit 400, memory circuit 500, memory circuit 700 or memory circuit 800. In some embodiments, the LIO circuit includes LIO circuit 110BS. In some embodiments, the first memory cell is coupled to the LIO circuit.

In some embodiments, the first memory cell includes at least one of memory cell 112, or one or more memory cells in at least memory cell array 202 or memory cell 300. In some embodiments, the first clock signal includes clock signal CLK.

In some embodiments, operation 1006 includes at least one of operation 1008, 1010, 1012, 1014, 1016, 1018 or 1020.

In operation 1008 of method 1000, a switching circuit 406 is disabled in response to the third control signal.

In operation 1010 of method 1000, a first data line and a second data line are pre-charged to a pre-charge voltage (e.g., voltage VDL), and a voltage of the first data line and the second data line are equalized in response to a pre-charge control signal (e.g., signal DLEQB). In some embodiments, the switching circuit is coupled to the first data line and the second data line.

In some embodiments, operation 1010 is performed by a pre-charge/equalization circuit. In some embodiments, the pre-charge/equalization circuit includes pre-charge and equalization circuit 420. In some embodiments, the first data line includes one of data line DL or data line bar DLB, and the second data line includes the other of data line DL or data line bar DLB. In some embodiments, the pre-charge/equalization circuit includes pre-charge and equalization circuit 420.

In operation 1012 of method 1000, a first latch circuit is enabled and configured as a sense amplifier in response to at least the third control signal and the sense amplifier signal. In some embodiments, the first latch circuit is coupled to the first data line and the second data line.

In some embodiments, the first latch circuit includes at least one of latch circuit 410 or latch circuit 810.

In operation 1014 of method 1000, a first data line signal and a second data line signal are sensed by the first latch circuit in response to at least the third control signal and the sense amplifier signal.

In some embodiments, the first data line signal is a signal of the first data line. In some embodiments, the second data line signal is a signal of the second data line.

In operation 1016 of method 1000, the first data line signal is transferred to an output node (e.g., node NO) of the second circuit in response to the sense amplifier signal and the inverted sense amplifier signal. In some embodiments, the first data line signal is transferred by a second latch circuit to the output node of the second circuit.

In some embodiments, the second latch circuit is coupled to the first data line and the first latch. In some embodiments, the second latch circuit includes at least one of latch circuit 440 or latch circuit 740.

In operation 1018 of method 1000, the first data line signal is latched in response to the sense amplifier signal and the inverted sense amplifier signal. In some embodiments, the first data line signal is latched by the second latch circuit.

In operation 1020 of method 1000, a first value of datum stored in the first memory cell is output by the LIO circuit. In some embodiments, the first data line signal corresponds to the first value of the datum stored in the first memory cell. In some embodiments, first value of datum includes a logic 0 or a logic 1.

In operation 1022 of method 1000, a second value of datum is written to the first memory cell in response to at least the third control signal, the first control signal or the first clock signal. In some embodiments, second value of datum includes a logic 0 or a logic 1.

In some embodiments, second value of datum is equal to the first value of datum. In some embodiments, second value of datum is different from the first value of datum.

In some embodiments, operation 1022 is performed by the LIO circuit. In some embodiments, operation 1022 is performed on a same memory cell as operation 1006. In some embodiments, operation 1022 is performed on a different memory cell as operation 1006.

In some embodiments, operation 1022 includes at least one of operation 1024, 1026, 1028, 1030, 1032 or 1034.

In operation 1024 of method 1000, the switching circuit 406 is enabled or turned on in response to the third control signal, and a first input signal (e.g., data signal Din) and a second input signal (e.g., data signal DinB) are transferred to the corresponding first data line and the second data line.

In operation 1026 of method 1000, the first latch circuit is set to be configured as a write-in latch circuit that is set in a transparent state in response to at least the third control signal.

In operation 1028 of method 1000, the switching circuit 406 is disabled or turned off in response to the third control signal.

In operation 1030 of method 1000, the first latch circuit configured as the write-in latch is set to be in a latched state in response to at least the third control signal and the first control signal.

In operation 1032 of method 1000, a first signal (e.g., signal WC or signal WT) is set in response to a second clock signal (e.g., clock signal WCLK) and at least the first data line signal or the second data line signal.

In some embodiments, the first signal (e.g., WC/WT) is set by a first NOR logic gate. In some embodiments, the first NOR logic gate includes at least one of NOR logic gate NOR2 or NOR logic gate NOR3. In some embodiments, the first signal (e.g., WC/WT) is set by output circuit 430.

In operation 1034 of method 1000, a first transistor is turned on in response to the first signal thereby setting a voltage of a first bit line or a second bit line. In some embodiments, the voltage of the first bit line or the second bit line corresponds to the second value of the datum stored in the first memory cell.

In some embodiments, the first transistor includes at least one of NMOS transistor MN12 or NMOS transistor MN13. In some embodiments, the first bit line includes one of bit line BL or bit line bar BLB, and the second bit line includes the other of bit line BL or bit line bar BLB.

By operating method 1000, the circuit operates to achieve the benefits discussed above with respect to at least one of memory circuit 100 of FIG. 1, memory circuit 200 of FIG. 2, memory circuit 400 of FIG. 4, memory circuit 500 of FIG. 5, memory circuit 700 of FIG. 7, or memory circuit 800 of FIG. 8 or memory cell 300 of FIG. 3 or timing diagram 600 of FIG. 6 and timing diagram 900 of FIG. 9.

In some embodiments, one or more of the operations of method 1000 is not performed. Furthermore, various PMOS or NMOS transistors shown in FIGS. 3-4 and 6-8 are of a particular dopant type (e.g., N-type or P-type) are for illustration purposes. Embodiments of the disclosure are not limited to a particular transistor type, and one or more of the PMOS or NMOS transistors shown in FIGS. 3-5 and 7-8 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of inverters in FIGS. 3-5 and 7-8 is within the scope of various embodiments. Selecting different numbers of transistors in FIGS. 3-5 and 7-8 is within the scope of various embodiments. Selecting different numbers of NOR logic gates in FIGS. 4 and 7-8 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a memory circuit. The memory circuit includes a set of memory cells, a first bit line and a second bit line coupled to the set of memory cells, and a local input output (LIO) circuit coupled to the set of memory cells by the first bit line and the second bit line. In some embodiments, the LIO circuit includes a first data line and a second data line, a first control circuit configured to generate a first sense amplifier signal and a second sense amplifier signal that is inverted from the first sense amplifier signal, and a second control circuit configured to generate a first control signal in response to at least a second control signal or a third control signal. In some embodiments, the LIO circuit further includes a switching circuit coupled to the first data line, the second data line and the second control circuit, and being configured to receive the third control signal, and configured to transfer a first input signal and a second input signal to the corresponding first data line and the second data line during a write operation of the set of memory cells, and to electrically isolate the first data line and the second data line from the first input signal and the second input signal during a read operation of the set of memory cells. In some embodiments, the LIO circuit further includes a first latch circuit coupled to the first data line, the second data line, the first control circuit and the second control circuit, the first latch circuit being configured as a sense amplifier, during the read operation, in response to the third control signal and the second sense amplifier signal, and the first latch circuit being configured as a write-in latch, during the write operation, in response to the third control signal and the first control signal.

Another aspect of this description relates to a memory circuit. The memory circuit includes a set of memory cells, a first bit line and a second bit line coupled to the set of memory cells, a first data line and a second data line, and a first control circuit configured to receive a global sense amplifier signal, and to generate a first sense amplifier signal and a second sense amplifier signal that is inverted from the first sense amplifier signal. In some embodiments, the memory circuit further includes a second control circuit configured to generate a first control signal in response to at least a second control signal or a third control signal. The memory circuit further includes a third control circuit coupled between the first control circuit and the second control circuit, and configured to generate the second control signal in response to the global sense amplifier signal and a fourth control signal. The memory circuit further includes a switching circuit coupled to the first data line, the second data line and the second control circuit, and being configured to receive the third control signal, and configured to transfer a first input signal and a second input signal to the corresponding first data line and the second data line during a write operation of the set of memory cells, and to electrically isolate the first data line and the second data line from the first input signal and the second input signal during a read operation of the set of memory cells. The memory circuit further includes a first latch circuit coupled to the first data line, the second data line, the first control circuit and the second control circuit, the first latch circuit being configured as a sense amplifier, during the read operation, in response to the third control signal and the second sense amplifier signal, and the first latch circuit being configured as a write-in latch, during the write operation, in response to the third control signal and the first control signal.

Still another aspect of this description relates to a method of operating a memory circuit. The method includes generating, by a first control circuit, an inverted sense amplifier signal and a sense amplifier signal that is inverted from the inverted sense amplifier signal. In some embodiments, the method further includes generating, by a second control circuit, a first control signal in response to at least a second control signal or a third control signal. In some embodiments, the method further includes reading, by a local input output (LIO) circuit, a first memory cell in response to at least the sense amplifier signal, the second control signal or a first clock signal, the first memory cell being coupled to the LIO circuit. In some embodiments, reading the first memory cell includes disabling a switching circuit in response to the third control signal, pre-charging, by a pre-charge/equalization circuit, a first data line and a second data line to a pre-charge voltage, and equalizing a voltage of the first data line and the second data line in response to a pre-charge control signal, the switching circuit being coupled to the first data line and the second data line. In some embodiments, reading the first memory cell further includes enabling a first latch circuit configured as a sense amplifier in response to at least the third control signal and the sense amplifier signal, the first latch circuit being coupled to the first data line and the second data line. In some embodiments, reading the first memory cell further includes sensing, by the first latch circuit, a first data line signal and a second data line signal in response to at least the third control signal and the sense amplifier signal. In some embodiments, reading the first memory cell further includes transferring, by a second latch circuit, the first data line signal to an output node of the second latch circuit in response to the sense amplifier signal and the inverted sense amplifier signal, the second latch circuit being coupled to the first data line and the first latch circuit. In some embodiments, reading the first memory cell further includes latching, by the second latch circuit, the first data line signal in response to the sense amplifier signal and the inverted sense amplifier signal. In some embodiments, reading the first memory cell further includes outputting, by the LIO circuit a first value of datum stored in the first memory cell, wherein the first data line signal corresponds to the first value of the datum stored in the first memory cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
    a set of memory cells;
    a first bit line and a second bit line coupled to the set of memory cells;
    a local input output (LIO) circuit coupled to the set of memory cells by the first bit line and the second bit line, the LIO circuit comprising:
        a first data line and a second data line;
        a first control circuit configured to generate a first sense amplifier signal and a second sense amplifier signal that is inverted from the first sense amplifier signal;
        a second control circuit configured to generate a first control signal in response to at least a second control signal or a third control signal;
        a switching circuit coupled to the first data line, the second data line and the second control circuit, and being configured to receive the third control signal, and configured to transfer a first input signal and a second input signal to the corresponding first data line and the second data line during a write operation of the set of memory cells, and to electrically isolate the first data line and the second data line from the first input signal and the second input signal during a read operation of the set of memory cells; and
        a first latch circuit coupled to the first data line, the second data line, the first control circuit and the second control circuit, the first latch circuit being configured as a sense amplifier, during the read operation, in response to the third control signal and the second sense amplifier signal, and the first latch circuit being configured as a write-in latch, during the write operation, in response to the third control signal and the first control signal.

2. The memory circuit of claim 1, wherein the LIO circuit further comprises:
    a second latch circuit coupled to the first data line and the first latch circuit, and configured to transfer a first data line signal to an output node of the second latch circuit, during the read operation, in response to the second sense amplifier signal and the first sense amplifier signal.

3. The memory circuit of claim 1, wherein the LIO circuit further comprises:
    a pre-charge/equalization circuit configured to pre-charge the first data line and the second data line to a pre-charge voltage, and to equalize a voltage of the first data line and the second data line in response to a pre-charge control signal, the pre-charge/equalization circuit being coupled to the first data line and the second data line.

4. The memory circuit of claim 1, wherein the LIO circuit further comprises:
    a first N-type transistor having a first gate configured to receive the third control signal, a first source configured to receive the first input signal, and a first drain coupled with the first data line and being coupled to the first latch circuit by a first node; and
    a second N-type transistor having a second gate configured to receive the third control signal, a second source configured to receive the second input signal, and a second drain coupled with the second data line and being coupled to the first latch circuit by a second node.

5. The memory circuit of claim 1, wherein the first latch circuit comprises:
    a first inverter coupled to the first data line and a first node;
    a second inverter coupled to the second data line and the first node, the first inverter and the second inverter are cross-coupled with each other;

a header switch configured to receive the third control signal, and being coupled to a first voltage supply and to the first inverter and the second inverter by the first node;

a first footer switch configured to receive the second sense amplifier signal, and being coupled between a second node and a second supply voltage different from the first supply voltage; and a second footer switch configured to receive the first control signal, and being coupled between the second node and the second supply voltage.

6. The memory circuit of claim 1, wherein the first control circuit comprises:

a first inverter configured to generate the first sense amplifier signal in response to a global sense amplifier signal, the first inverter including a first input terminal coupled to a global input output (GIO) circuit, and a first output terminal; and a second inverter configured to generate the second sense amplifier signal in response to the first sense amplifier signal, the second inverter including a second input terminal coupled to the first output terminal, and a second output terminal coupled to the first latch circuit.

7. The memory circuit of claim 1, wherein the second control circuit comprises:

a first inverter configured to generate the third control signal in response to a fourth control signal, the first inverter including a first input terminal coupled to a global input output circuit, and a first output terminal; and a first NOR logic gate having a first NOR input terminal coupled to the first output terminal, and configured to receive the third control signal, and a second NOR input terminal configured to receive the second control signal, and a first NOR output terminal configured to output the first control signal.

8. The memory circuit of claim 1, wherein the LIO circuit further comprises:

an output circuit coupled between the first data line and the second data line and the first bit line and the second bit line, the output circuit being configured to write data into the set of memory cells during the write operation.

9. The memory circuit of claim 8, wherein the output circuit comprises:

a first NOR logic gate configured to generate a first signal in response to a second clock signal, and a first data line signal;

a second NOR logic gate configured to generate a second signal in response to the second clock signal, and a second data line signal;

a first N-type transistor having a first gate coupled to an output of the first NOR logic gate, and being configured to receive the first signal, a first source coupled to a reference supply voltage, and a first drain coupled with the first bit line; and a second N-type transistor having a second gate coupled to an output of the second NOR logic gate, and being configured to receive the second signal, a second source coupled to the reference supply voltage, and a second drain coupled with the second bit line.

10. A memory circuit comprising:
a set of memory cells;
a first bit line and a second bit line coupled to the set of memory cells;
a first data line and a second data line;
a first control circuit configured to receive a global sense amplifier signal, and to generate a first sense amplifier signal and a second sense amplifier signal that is inverted from the first sense amplifier signal;

a second control circuit configured to generate a first control signal in response to at least a second control signal or a third control signal;

a third control circuit coupled between the first control circuit and the second control circuit, and configured to generate the second control signal in response to the global sense amplifier signal and a fourth control signal;

a switching circuit coupled to the first data line, the second data line and the second control circuit, and being configured to receive the third control signal, and configured to transfer a first input signal and a second input signal to the corresponding first data line and the second data line during a write operation of the set of memory cells, and to electrically isolate the first data line and the second data line from the first input signal and the second input signal during a read operation of the set of memory cells; and a first latch circuit coupled to the first data line, the second data line, the first control circuit and the second control circuit, the first latch circuit being configured as a sense amplifier, during the read operation, in response to the third control signal and the second sense amplifier signal, and the first latch circuit being configured as a write-in latch, during the write operation, in response to the third control signal and the first control signal.

11. The memory circuit of claim 10, wherein the first control circuit comprises:

a first inverter configured to generate the first sense amplifier signal in response to the global sense amplifier signal, the first inverter including a first input terminal coupled to a global input output (GIO) circuit, and a first output terminal; and a second inverter configured to generate the second sense amplifier signal in response to the first sense amplifier signal, the second inverter including a second input terminal coupled to the first output terminal, and a second output terminal coupled to the first latch circuit.

12. The memory circuit of claim 11, wherein the second control circuit comprises:

a third inverter configured to generate the third control signal in response to a fifth control signal, the third inverter including a third input terminal coupled to the GIO circuit, and a third output terminal; and a first NOR logic gate having a first NOR input terminal coupled to the third output terminal, and configured to receive the third control signal, and a second NOR input terminal configured to receive the second control signal, and a first NOR output terminal configured to output the first control signal.

13. The memory circuit of claim 12, wherein the third control circuit comprises:

a second NOR logic gate having a third NOR input terminal coupled to the first input terminal, and configured to receive the global sense amplifier signal, and a fourth NOR input terminal configured to receive the fourth control signal, and a second NOR output terminal coupled to the second NOR input terminal, and configured to output the second control signal.

14. The memory circuit of claim 10, wherein the first latch circuit comprises:

a first inverter coupled to the first data line and a first node;

a second inverter coupled to the second data line and the first node, the first inverter and the second inverter are cross-coupled with each other;
a header switch configured to receive the third control signal, and being coupled to a first voltage supply and to the first inverter and the second inverter by the first node; and
a footer switch configured to receive the first control signal, and being coupled to the second control circuit, a second node and a second supply voltage different from the first supply voltage.

15. The memory circuit of claim 10, further comprising:
an output circuit coupled between the first data line and the second data line and the first bit line and the second bit line, the output circuit being configured to write data into the set of memory cells during the write operation.

16. The memory circuit of claim 10, further comprising:
a second latch circuit coupled to the first data line and the first latch circuit, and configured to transfer a first data line signal to an output node of the second latch circuit, during the read operation, in response to the second sense amplifier signal and the first sense amplifier signal.

17. The memory circuit of claim 10, further comprising:
a pre-charge/equalization circuit configured to pre-charge the first data line and the second data line to a pre-charge voltage, and to equalize a voltage of the first data line and the second data line in response to a pre-charge control signal, the pre-charge/equalization circuit being coupled to the first data line and the second data line.

18. The memory circuit of claim 17, wherein the pre-charge/equalization circuit comprises:
a first P-type transistor comprising:
a first terminal of the first P-type transistor being configured to receive the pre-charge control signal;
a second terminal of the first P-type transistor being coupled to the first data line; and
a third terminal of the first P-type transistor being coupled to at least a first voltage supply;
a second P-type transistor comprising:
a first terminal of the second P-type transistor being configured to receive the pre-charge control signal;
a second terminal of the second P-type transistor being coupled to the second data line; and
a third terminal of the second P-type transistor being coupled to the first voltage supply and the third terminal of the first P-type transistor; and
a third P-type transistor comprising:
a first terminal of the third P-type transistor being configured to receive the pre-charge control signal;
a second terminal of the third P-type transistor being coupled to the first data line; and
a third terminal of the third P-type transistor being coupled to the second data line.

19. A method of operating a memory circuit, the method comprising:
generating, by a first control circuit, an inverted sense amplifier signal and a sense amplifier signal that is inverted from the inverted sense amplifier signal;
generating, by a second control circuit, a first control signal in response to at least a second control signal or a third control signal; and
reading, by a local input output (LIO) circuit, a first memory cell in response to at least the sense amplifier signal, the second control signal or a first clock signal, the first memory cell being coupled to the LIO circuit, wherein reading the first memory cell comprises:
disabling a switching circuit in response to the third control signal;
pre-charging, by a pre-charge/equalization circuit, a first data line and a second data line to a pre-charge voltage, and equalizing a voltage of the first data line and the second data line in response to a pre-charge control signal, the switching circuit being coupled to the first data line and the second data line;
enabling a first latch circuit configured as a sense amplifier in response to at least the third control signal and the sense amplifier signal, the first latch circuit being coupled to the first data line and the second data line;
sensing, by the first latch circuit, a first data line signal and a second data line signal in response to at least the third control signal and the sense amplifier signal;
transferring, by a second latch circuit, the first data line signal to an output node of the second latch circuit in response to the sense amplifier signal and the inverted sense amplifier signal, the second latch circuit being coupled to the first data line and the first latch circuit;
latching, by the second latch circuit, the first data line signal in response to the sense amplifier signal and the inverted sense amplifier signal; and
outputting, by the LIO circuit, a first value of datum stored in the first memory cell, wherein the first data line signal corresponds to the first value of the datum stored in the first memory cell.

20. The method of claim 19, further comprising:
writing, by the LIO circuit, a second value of datum to the first memory cell in response to at least the third control signal, the first control signal or the first clock signal, wherein writing the second value of the datum to the first memory cell comprises:
enabling the switching circuit in response to the third control signal, and transferring a first input signal and a second input signal to the corresponding first data line and the second data line;
setting/enabling the first latch circuit to be configured as a write-in latch, and to be in a transparent state in response to at least the third control signal;
disabling the switching circuit in response to the third control signal;
setting/enabling the first latch circuit configured as the write-in latch to be in a latched state in response to at least the third control signal and the first control signal;
setting, by a first NOR logic gate, a first signal in response to a second clock signal and at least the first data line signal or the second data line signal; and
turning on a first transistor in response to the first signal thereby setting a voltage of a first bit line or a second bit line, wherein the voltage of the first bit line or the second bit line corresponds to the second value of the datum stored in the first memory cell.

* * * * *